(12) United States Patent
Kim et al.

(10) Patent No.: US 8,178,424 B2
(45) Date of Patent: May 15, 2012

(54) METHOD OF FABRICATING LIGHT-EMITTING APPARATUS WITH IMPROVED LIGHT EXTRACTION EFFICIENCY AND LIGHT-EMITTING APPARATUS FABRICATED USING THE METHOD

(75) Inventors: Yu-Sik Kim, Suwon-si (KR);
Seong-Deok Hwang, Seoul (KR);
Seung-Jae Lee, Cheonan-si (KR);
Sun-Pil Youn, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/590,526

(22) Filed: Nov. 10, 2009

(65) Prior Publication Data

US 2010/0120183 A1   May 13, 2010

(30) Foreign Application Priority Data

Nov. 10, 2008   (KR) .................. 10-2008-0111060

(51) Int. Cl.
*H01L 33/00*   (2010.01)
(52) U.S. Cl. ..... 438/463; 438/29; 438/33; 257/E33.066; 257/E33.067
(58) Field of Classification Search .................. 438/463
See application file for complete search history.

(56) References Cited

U.S. PATENT DOCUMENTS

| | | | |
|---|---|---|---|
| 6,252,894 B1 * | 6/2001 | Sasanuma et al. | 372/45.01 |
| 6,294,814 B1 * | 9/2001 | Henley et al. | 257/347 |
| 6,974,760 B2 * | 12/2005 | Ghyselen et al. | 438/459 |
| 7,052,978 B2 * | 5/2006 | Shaheen et al. | 438/463 |
| 7,157,294 B2 | 1/2007 | Uemura et al. | |
| 7,160,744 B2 | 1/2007 | Park et al. | |
| 2002/0197764 A1 | 12/2002 | Uemura et al. | |
| 2005/0173387 A1 * | 8/2005 | Fukuyo et al. | 219/121.67 |
| 2005/0230699 A1 * | 10/2005 | Wu et al. | 257/98 |
| 2006/0038190 A1 | 2/2006 | Park et al. | |
| 2007/0054476 A1 * | 3/2007 | Nakahata et al. | 438/483 |
| 2007/0108462 A1 | 5/2007 | Park et al. | |
| 2008/0090382 A1 * | 4/2008 | Fujii et al. | 438/463 |
| 2009/0035885 A1 * | 2/2009 | Karlicek et al. | 438/45 |

FOREIGN PATENT DOCUMENTS

| | | |
|---|---|---|
| JP | 2002-368263 A | 12/2002 |
| KR | 10-0649494 B1 | 11/2006 |
| KR | 10-0697829 B1 | 3/2007 |

* cited by examiner

*Primary Examiner* — N Drew Richards
*Assistant Examiner* — Robert Carpenter
(74) *Attorney, Agent, or Firm* — Onello & Mello, LLP

(57) ABSTRACT

Provided are a method of fabricating a light-emitting apparatus with improved light extraction efficiency and a light-emitting apparatus fabricated using the method. The method includes: preparing a monocrystalline substrate; forming an intermediate structure on the substrate, the intermediate structure comprising a light-emitting structure which comprises a first conductive pattern of a first conductivity type, a light-emitting pattern, and a second conductive pattern of a second conductivity type stacked sequentially, a first electrode which is electrically connected to the first conductive pattern, and a second electrode which is electrically connected to the second conductive pattern; forming a polycrystalline region, which extends in a horizontal direction, by irradiating a laser beam to the substrate in the horizontal direction such that the laser beam is focused on a beam-focusing point within the substrate; and cutting the substrate in the horizontal direction along the polycrystalline region.

15 Claims, 24 Drawing Sheets

METHOD OF FABRICATING LIGHT-EMITTING APPARATUS WITH IMPROVED LIGHT EXTRACTION EFFICIENCY AND LIGHT-EMITTING APPARATUS FABRICATED USING THE METHOD This application claims priority from Korean Patent Application No. 10-2008-0111060 filed on Nov. 10, 2008 in the Korean Intellectual Property Office, the entire contents of which are incorporated herein by reference.

BACKGROUND

1. Field of the Invention

The present inventive concept relates to a method of fabricating a light-emitting apparatus and a light-emitting apparatus fabricated using the method.

2. Description of the Related Art

Light-emitting apparatuses such as light-emitting diodes (LEDs) emit light when electrons combine with holes. Light-emitting apparatuses consume low power, have a long life, can be installed in a limited space, and are resistant to vibrations.

A major challenge in the development of light-emitting apparatuses is to improve light extraction efficiency. Light extraction efficiency is the proportion of light, which exits a light-emitting apparatus into, for example, air or transparent resin that surrounds the light-emitting apparatus), in light generated within the light-emitting apparatus. A light-emitting apparatus may have an optical refractive index of approximately 2.2 to 3.8, air may have an optical refractive index of 1, and transparent resin may have an optical refractive index of approximately 1.5.

For example, when a light-emitting apparatus has an optical refractive index of 3.4, a portion of light generated within the light-emitting apparatus may exitexit the light-emitting apparatus into the air at a critical angle of approximately 17 degrees and into transparent resin at a critical angle of approximately 26 degrees.

In this case, the light extraction efficiency of the light-emitting apparatus is approximately 2.2% when a portion of light generated within the light-emitting apparatus exits the light-emitting apparatus into the air, and the light extraction efficiency of the light-emitting apparatus is approximately 4% when the portion of the light generated within the light-emitting apparatus exits the light-emitting apparatus into transparent resin. The other portion of the light is reflected by a surface of the light-emitting apparatus and trapped in the light-emitting apparatus.

SUMMARY

Aspects of the present inventive concept provide a method of fabricating a light-emitting apparatus with improved light extraction efficiency.

Aspects of the present inventive concept also provide a light-emitting apparatus fabricated using the above method.

According to an aspect of the present inventive concept, there is provided a method of fabricating a light-emitting apparatus. The method includes: preparing a monocrystalline substrate; forming an intermediate structure on the substrate, the intermediate structure comprising a light-emitting structure which comprises a first conductive pattern of a first conductivity type, a light-emitting pattern, and a second conductive pattern of a second conductivity type stacked sequentially, a first electrode which is electrically connected to the first conductive pattern, and a second electrode which is electrically connected to the second conductive pattern; forming a polycrystalline region, which extends in a horizontal direction, by irradiating a laser beam to the substrate in the horizontal direction such that the laser beam is focused on a beam-focusing point within the substrate; and cutting the substrate in the horizontal direction along the polycrystalline region.

In one embodiment, the method further comprises bonding the substrate having the intermediate structure formed thereon to a support substrate between the forming of the intermediate structure and the forming of the polycrystalline region.

In one embodiment, the first conductive pattern has a protruding region since the first conductive pattern is wider than the second conductive pattern, the first electrode is formed on the protruding region of the first conductive pattern, the second electrode is formed on the second conductive pattern, and the substrate having the intermediate structure formed thereon is bonded to the support substrate such that the first and second electrodes face the support substrate.

In one embodiment, sidewalls of the light-emitting structure are inclined, and the second electrode is formed on a top surface and the sidewalls of the light-emitting structure.

In one embodiment, when the substrate is cut in the horizontal direction, the substrate is divided into a first substrate and a second substrate from the polycrystalline region, wherein the intermediate structure is formed on a first surface of one of the first and second substrates, and a cut pattern region is formed on a second surface of one of the first and second substrates, wherein at least part of the cut pattern region is polycrystalline. In one embodiment, the method further comprises forming a reflective metal film on the second surface of one of the first and second substrates on which the cut pattern region is formed.

In one embodiment, the laser beam has a wavelength of more than 1000 nm.

According to another aspect of the present inventive concept, there is provided a method of fabricating a light-emitting apparatus. The method includes: preparing a monocrystalline substrate; forming an intermediate structure on the substrate, the intermediate structure comprising a light-emitting structure which comprises a first conductive pattern of a first conductivity type, a light-emitting pattern, and a second conductive pattern of a second conductivity type stacked sequentially, a first electrode which is electrically connected to the first conductive pattern, and a second electrode which is electrically connected to the second conductive pattern; forming a region, whose material quality is different from that of the other regions of the substrate and which extends in a horizontal direction, by irradiating a laser beam to the substrate in the horizontal direction such that the laser beam is focused on a beam-focusing point within the substrate; and cutting the substrate in the horizontal direction along the region.

According to another aspect of the present inventive concept, there is provided a light-emitting apparatus including: a substrate having a first surface and a second surface; a light-emitting structure including a first conductive pattern of a first conductivity type, a light-emitting pattern, and a second conductive pattern of a second conductivity type which are stacked sequentially on the first surface of the substrate; a first electrode electrically connected to the first conductive pattern; and a second electrode electrically connected to the second conductive pattern, wherein a cut pattern region is formed on the second surface of the substrate, the substrate is monocrystalline, and at least part of the cut pattern region is polycrystalline.

In one embodiment, the apparatus further comprises a support substrate attached to the substrate, wherein the first and second electrodes face the support substrate.

Aspects of the present inventive concept are not restricted to those set forth herein. The above and other aspects of the present inventive concept will become more apparent to one of ordinary skill in the art to which the present inventive concept pertains by referencing the detailed description of the present inventive concept given below.

BRIEF DESCRIPTION OF THE DRAWINGS

The foregoing and other features and advantages of the inventive concept will be apparent from the more particular description of preferred aspects of the inventive concept, as illustrated in the accompanying drawings in which like reference characters refer to the same parts throughout the different views. The drawings are not necessarily to scale, emphasis instead being placed upon illustrating the principles of the inventive concept. In the drawings, the thickness of layers and regions are exaggerated for clarity.

DETAILED DESCRIPTION OF THE EMBODIMENTS

Figure 1:
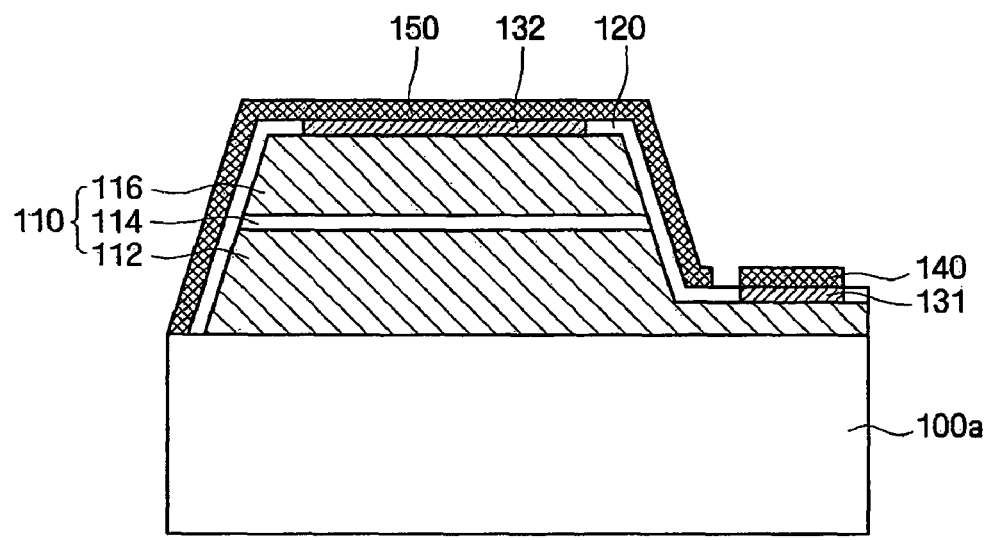
FIGS. 1 through 5 are views showing intermediate processes included in a method of fabricating a light-emitting device according to a first exemplary embodiment of the present inventive concept.

Advantages and features of the present inventive concept and methods of accomplishing the same may be understood more readily by reference to the following detailed description of exemplary embodiments and the accompanying drawings. The present inventive concept may, however, be embodied in many different forms and should not be construed as being limited to the embodiments set forth herein. Rather, these embodiments are provided so that this description will be thorough and complete and will fully convey the concept of the inventive concept to those skilled in the art, and the present inventive concept will only be defined by the appended claims. In the drawings, sizes and relative sizes of layers and regions may be exaggerated for clarity.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. As used herein, the term "and/or" includes any and all combinations of one or more of the associated listed items.

Spatially relative terms, such as "below", "beneath", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. Like reference numerals refer to like elements throughout the specification.

Embodiments of the inventive concept are described herein with reference to plan and cross-section illustrations that are schematic illustrations of idealized embodiments of the inventive concept. As such, variations from the shapes of the illustrations as a result, for example, of manufacturing techniques and/or tolerances, are to be expected. Thus, embodiments of the inventive concept should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the inventive concept.

Figure 3:
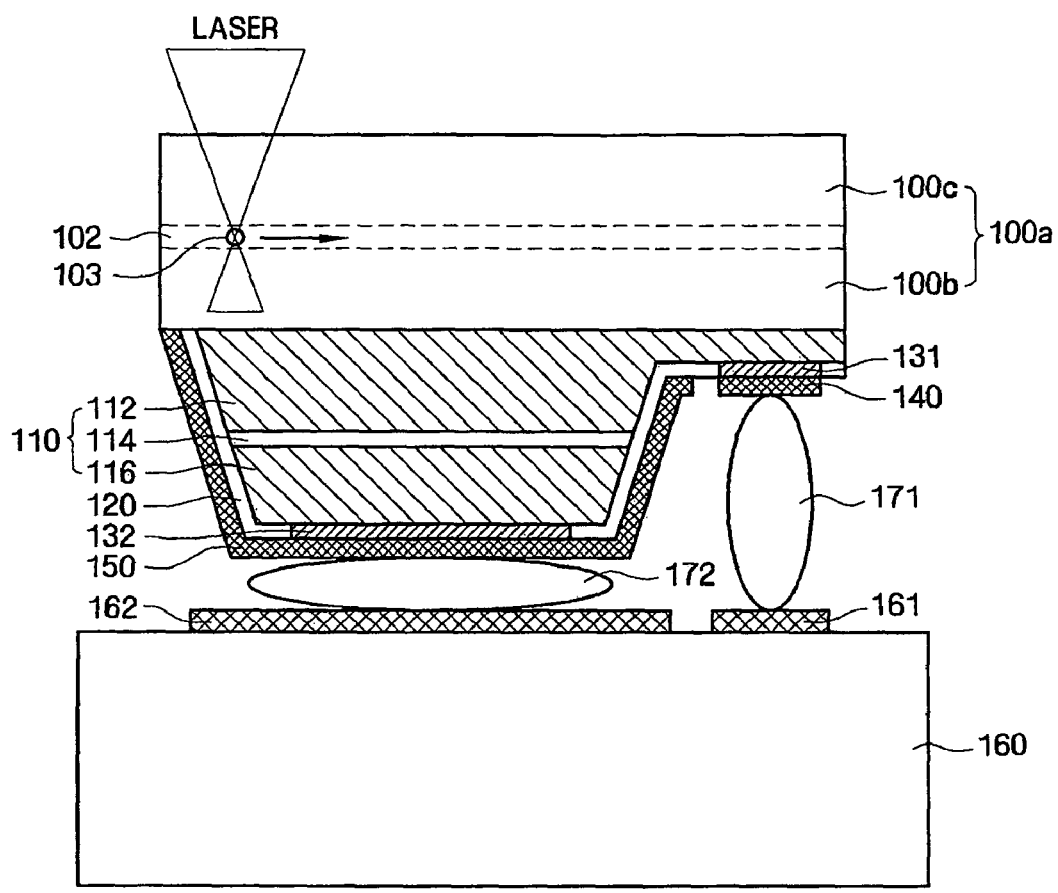
Figure 4:
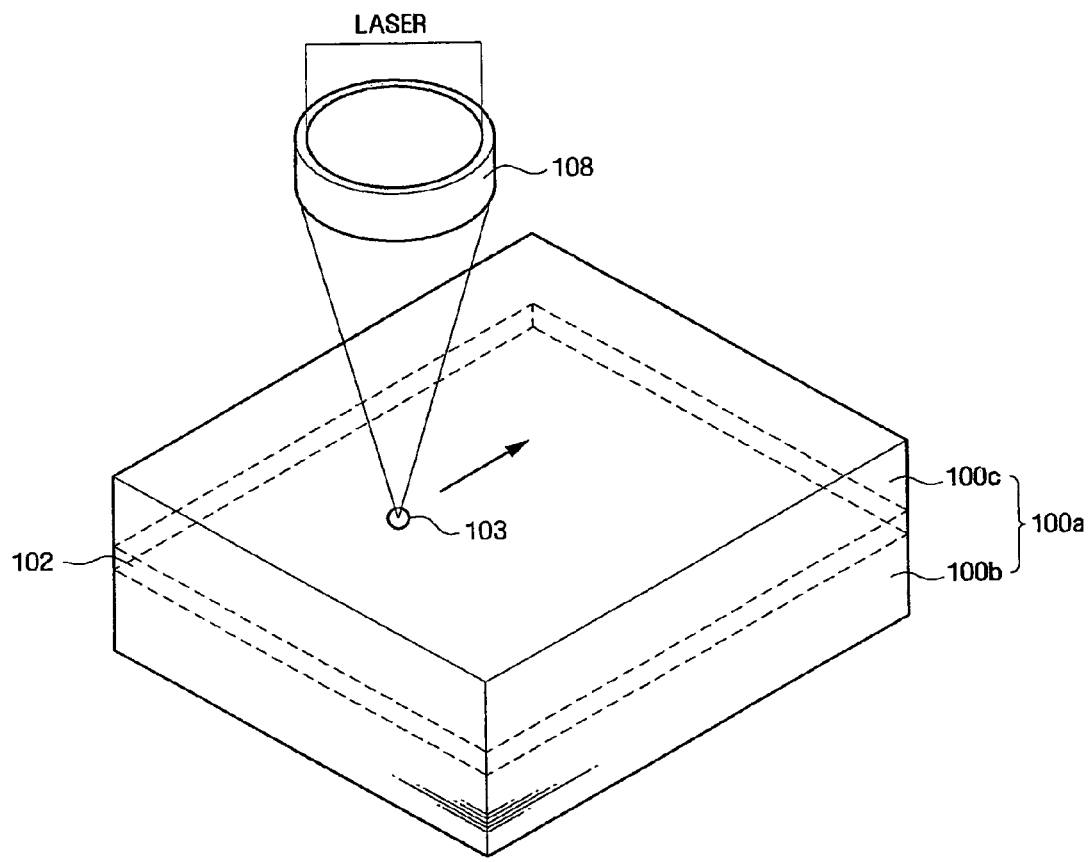
Figure 5:
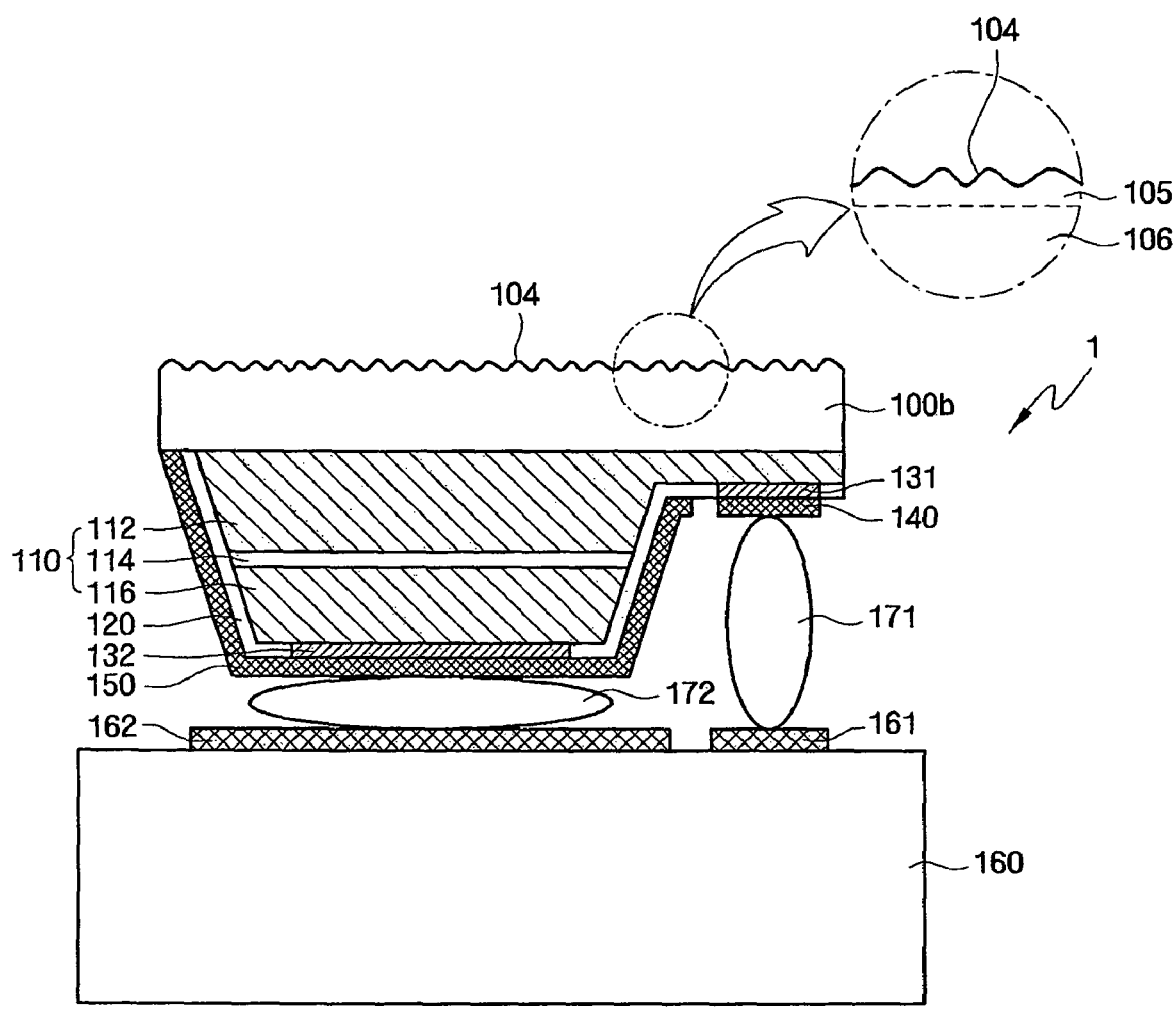
Figure 6:
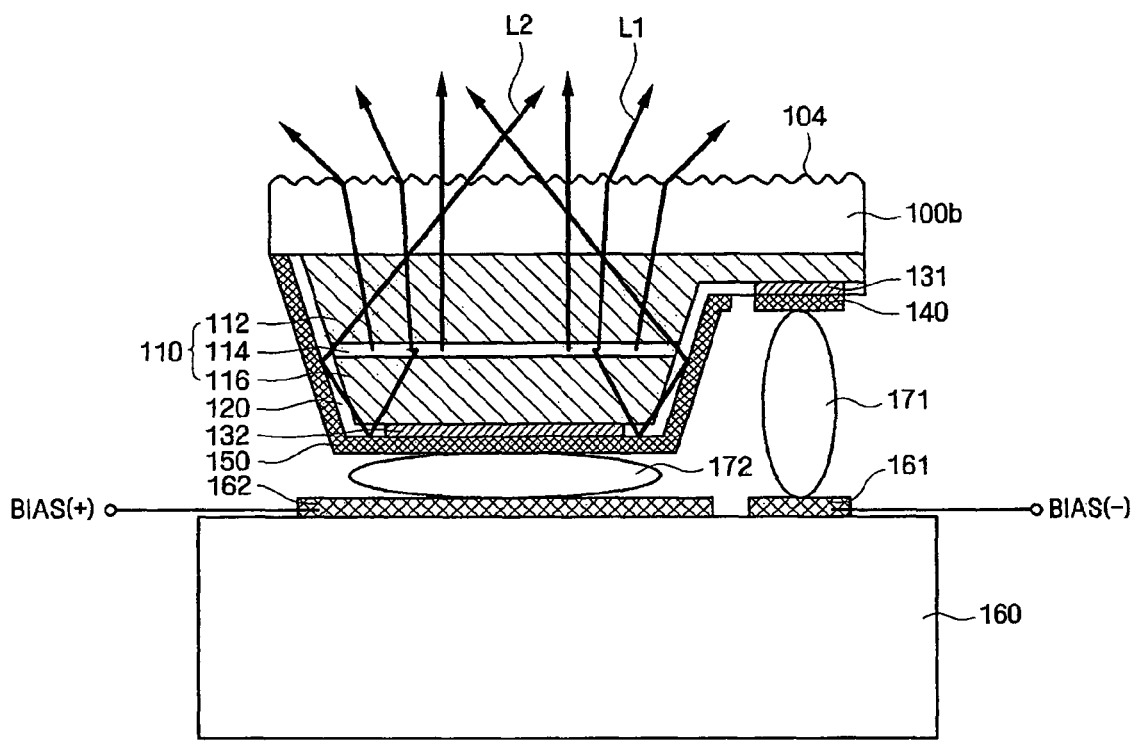
FIG. 6 is a view showing the operation of the light-emitting device according to the first exemplary embodiment of the present inventive concept.

FIGS. 1 through 5 are views showing intermediate processes included in a method of fabricating a light-emitting device 1 according to a first exemplary embodiment of the present inventive concept. In particular, FIG. 5 is a cross-sectional view showing a cut pattern region 104 of the light-emitting device 1 according to the first exemplary embodiment of the present inventive concept. FIG. 6 is a view showing the operation of the light-emitting device 1 according to the first exemplary embodiment of the present inventive concept.

Referring to FIG. 1, intermediate structures are formed on a substrate 100a, and the substrate 100a is separated into individual chips (intermediate structures).

Specifically, an intermediate structure shown in FIG. 1 includes the substrate 100a, a light-emitting structure 110 which includes a first conductive pattern 112, a light-emitting pattern 114, and a second conductive pattern 116 stacked sequentially, a first electrode 140 which is electrically connected to the first conductive pattern 112, and a second electrode 150 which is electrically connected to the second conductive pattern 116.

The substrate 100a may be monocrystalline. In addition, the substrate 100a may be made of a material from which the first conductive pattern 112, the light-emitting pattern 114, and the second conductive pattern 116 can grow. For example, the substrate 100a may be an insulating substrate made of sapphire ($Al_2O_3$) or zinc oxide (ZnO) or may be a conductive substrate made of silicon (Si), silicon carbide (SiC), or gallium nitride (GaN).

The first conductive pattern 112, the light-emitting pattern 114, and the second conductive pattern 116 of the light-emitting structure 110 may include $In_xAl_yGa_{(1-x-y)}N$ ($0 \leq x \leq 1$, $0 \leq y \leq 1$) (i.e., various materials containing GaN). For example, the first conductive pattern 112, the light-emitting pattern 114, and the second conductive pattern 116 may include AlGaN or InGaN.

The first conductive pattern 112 may be of a first conductivity type (e.g., an n type), and the second conductive pattern 116 may be of a second conductivity type (e.g., a p type). Conversely, the first conductive pattern 112 may be of the second conductivity type (the p type), and the second conductive pattern 116 may be of the first conductivity type (the n type), depending on the design of the light-emitting device.

The light-emitting pattern 114 is a region where light is generated when carriers (e.g., electrons) of the first conductive pattern 112 combine with carriers (e.g., holes) of the second conductive pattern 116. Although not specifically shown in the drawing, the light-emitting pattern 114 may include a well layer and a barrier layer. Since the well layer has a smaller band gap than the barrier layer, carriers (electrons and holes) gather in the well layer and combine together. The light-emitting pattern 114 may have a single quantum well (SQW) structure or a multiple quantum well (MQW) structure, depending on the number of well layers included in the light-emitting pattern 114. The SQW structure includes only one well layer while the MQW structure includes a plurality of well layers. In order to control light-emitting properties, at least one of the well layer and the barrier layer may be doped with at least one of boron (B), phosphorous (P), silicon (Si), magnesium (Mg), zinc (Zn), selenium (Se), and aluminum (Al).

The light-emitting structure 110 may have inclined sidewalls. The inclined sidewalls of the light-emitting structure 110 may allow light generated within the light-emitting pattern 114 to be reflected by the second electrode 150, which is formed on a top surface and the sidewalls of the light-emitting structure 110, and then to easily escape from the light-emitting structure 110 without being trapped within the light-emitting structure 110. That is, the light extraction efficiency of the light-emitting device 1 can be improved, which will be described in detail below with reference to FIG. 6.

As shown in FIG. 1, the first conductive pattern 112 may be wider than the second conductive pattern 116 and the light-emitting pattern 114. Thus, a portion of the first conductive pattern 112 may protrude in a lateral direction (that is, the first conductive pattern 112 may protrude further than the second conductive pattern 116 or the light-emitting pattern 114).

An insulating layer 120 is conformally formed along the profile of the light-emitting structure 110 and patterned to expose a portion of the first conductive pattern 112 and a portion of the second conductive pattern 116. The insulating layer 120 may be a silicon oxide film, a silicon nitride film, an aluminum oxide film, or an aluminum nitride film.

A first ohmic layer 131 and the first electrode 140 may be formed on the portion of the first conductive pattern 112 exposed by the insulating layer 120, and a second ohmic layer 132 and the second electrode 150 may be formed on the portion of the second conductive pattern 116 exposed by the insulating layer 120. That is, the first electrode 140 may be formed on a protruding region of the first conductive pattern 112, and the second electrode 150 may be formed on the top surface and sidewalls of the light-emitting structure 110.

Each of the first and second ohmic layers 131 and 132 may include at least one of indium tin oxide (ITO), zinc (Zn), zinc oxide (ZnO), silver (Ag), tin (Ti), aluminum (Al), aurum (Au), nickel (Ni), indium oxide ($In_2O_3$), tin oxide ($SnO_2$), copper (Cu), tungsten (W), and platinum (Pt). In addition, each of the first and second electrodes 140 and 150 may include at least one of ITO, Cu, Ni, chrome (Cr), Au, titanium (Ti), Pt, Al, vanadium (V), W, molybdenum (Mo), and Ag.

Although not shown in the drawing, a buffer layer may be formed between the substrate 100a and the first conductive pattern 112. The buffer layer may be used as a seed layer for forming the first conductive pattern 112, the light-emitting pattern 114, and the second conductive pattern 116. In addition, the buffer layer may be used to prevent lattice mismatch between the substrate 100a and the light-emitting structure 110. Thus, the buffer layer improves the membranous properties of the light-emitting structure 110. The buffer layer may be made of any material that enables the buffer layer to serve as a seed layer. For example, the buffer layer may be made of $In_xAl_yGa_{(1-x-y)}N$ ($0 \leq x \leq 1$, $0 \leq y \leq 1$) or $Si_xC_yN_{(1-x-y)}$ ($0 \leq x \leq 1$, $0 \leq y \leq 1$).

Figure 2:
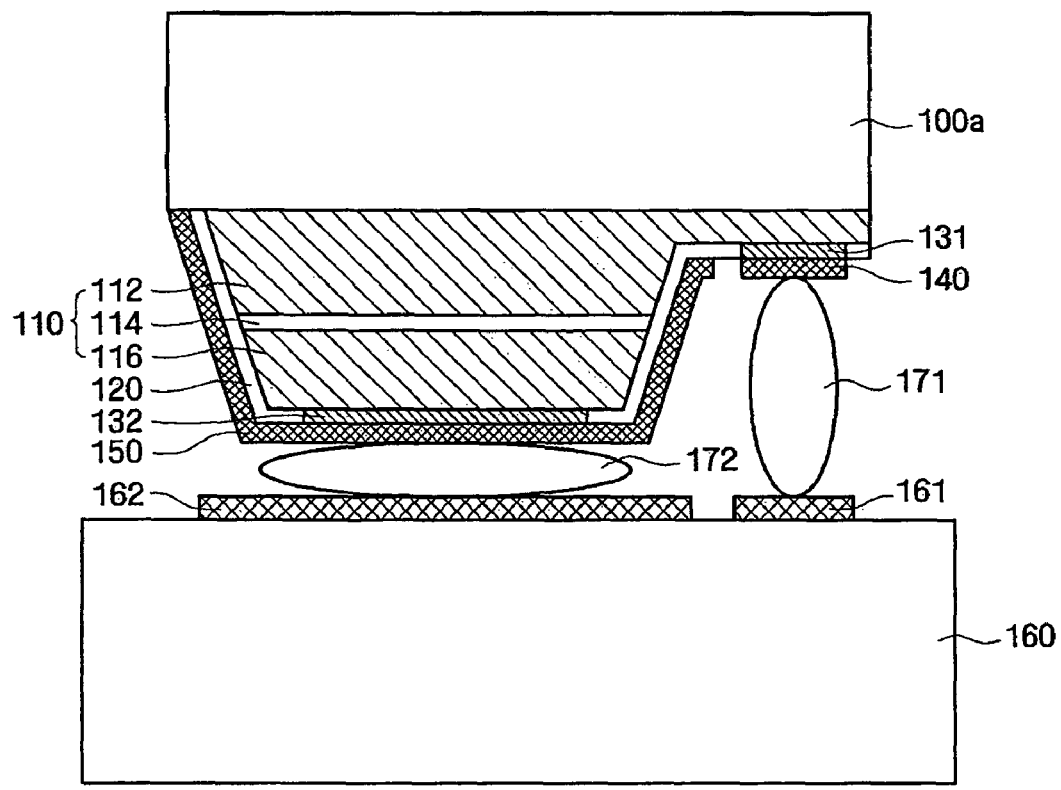

Referring to FIG. 2, the substrate 100a, on which the intermediate structure shown in FIG. 1 is formed, is bonded to a support substrate 160. Specifically, any substrate can be used as the support substrate 160 as long as it can bond the intermediate structure thereto. The support substrate 160 may be, for example, a submount, a circuit board, or a package. A first conductive region 161 and a second conductive region 162 may be formed on the support substrate 160 and may be electrically insulated from each other. The first and second conductive regions 161 and 162 may be disposed on a surface of the support substrate 160.

The substrate 100a and the support substrate 160 are bonded together such that the first and second electrodes 140 and 150 of the light-emitting device 1 face the support substrate 160. That is, the substrate 100a and the support substrate 160 may be bonded together in a flip-chip manner. Specifically, the first electrode 140 of the light-emitting device 1 may be connected to the first conductive region 161 of the support substrate 160 by a conductive solder 171, and the second electrode 150 of the light-emitting device 1 may be connected to the second conductive region 162 of the support substrate 160 by a conductive solder 172. Although not shown in the drawing, the second electrode 150 and the second conductive region 162 may also be directly attached and connected to each other without requiring the conductive solder 172.

Referring to FIGS. 3 and 4, a polycrystalline region 102 is formed in a predetermined region within the substrate 100a.

Specifically, a permeable nanosecond pulse laser beam may be irradiated to the substrate 100a in a horizontal direction such that it is focused on a beam-focusing point 103 within the substrate 100a. As a result, the polycrystalline region 102, which extends in the horizontal direction, may be formed within the substrate 100a. That is, when the substrate 100a is scanned with a laser beam, the polycrystalline region 102 may be formed within the substrate 100a. This is because the laser beam converts monocrystals of the substrate 100a into polycrystals. The polycrystalline region 102 formed as described above may divide the substrate 100a into a first substrate 100b and a second substrate 100c.

The horizontal direction may denote a direction in which the substrate 100a extends or a direction substantially parallel to a first or second surface of the substrate 100a.

Referring to FIG. 4, a laser beam may be concentrated by a focusing lens 108 to form the beam-focusing point 103 within the substrate 100a.

Here, the laser beam may have a wavelength that is not absorbed by a surface of the substrate 100a. A wavelength range of the laser beam, which can pass through the substrate 100a without being absorbed by the surface of the substrate 100a, may vary according to the material or thickness of the substrate 100a. In the case of a silicon substrate, the laser beam may have a wavelength range of more than 1000 nm, for example, a wavelength of 1065 nm. A laser beam having a wavelength range of less than 1000 nm cannot pass through the silicon substrate and thus cannot be used.

The beam-focusing point 103 may be formed at a specified depth from the surface of the substrate 100a. The specified depth at which the beam-focusing point 103 is formed may vary according to a thickness of the first substrate 100b which will remain after the substrate 100a is cut.

Referring to FIG. 5, the substrate 100a is cut in the horizontal direction along the polycrystalline region 102 to complete the light-emitting device 1.

Specifically, stress (e.g., tensile stress) is applied to the substrate 100a having the polycrystalline region 102 formed therein, thereby cutting the substrate 100a in the horizontal direction along the polycrystalline region 102. That is, since the second substrate 100c is separated from the first substrate 100b, the thickness of the substrate 100a, which has the light-emitting structure 110 and the first and second electrodes 140 and 150 formed on the first surface thereof, can be reduced.

In particular, when the substrate 100a is cut in the horizontal direction by using a laser beam, the cut pattern region 104 is formed on a second surface of the first substrate 100b. The second surface is opposite to the first surface on which the light-emitting structure 110 and the first and second electrodes 140 and 150 formed. As shown in the drawing, the cut pattern region 104 has roughness. Due to the cut pattern region 104 having a predetermined roughness, light generated within the light-emitting structure 110 can easily exitexit the substrate 100a without being trapped in the substrate 100a. In addition, since the first substrate 100b, which remains after the substrate 100a is cut, is thin, there is a low probability that the generated light will be trapped in the first substrate 100b.

At least part of the cut pattern region 104 may include a region 105 which includes polycrystals. For example, as shown in the drawing, a portion of the cut pattern region 104 may be the region 105 which includes polycrystals, and the other portion of the cut pattern region 104 may be a region 106 which includes monocrystals. This is because the substrate 100a is cut along the polycrystalline region 102 by applying stress mainly to the polycrystalline region 102. That is, polycrystals may remain on the cut surface of the substrate 100a.

Although not shown in the drawings, the substrate 100a may also be separated into individual chips after being cut in the horizontal direction by using a laser beam. Then, the chips may be attached to the support substrate in a flip-chip manner.

The operation of the light-emitting device 1 according to the first exemplary embodiment will now be described with reference to FIG. 6.

Referring to FIG. 6, when the first conductive pattern 112 is of the n type and when the second conductive pattern 116 is of the p type, a first bias BIAS(−) is applied to the first conductive pattern 112 via the first conductive region 161, the conductive solder 171, the first electrode 140 and the first ohmic layer 131, and a second bias BIAS(+) is applied to the second conductive pattern 116 via the second conductive region 162, the conductive solder 172, the second electrode 150 and the second ohmic layer 132. Conversely, when the first conductive pattern 112 is of the p type and when the second conductive pattern 116 is of the n type, the second bias BIAS(+) is applied to the first conductive pattern 112 via the first conductive region 161, the conductive solder 171, the first electrode 140 and the first ohmic layer 131, and the first bias BIAS(−) is applied to the second conductive pattern 116 via the second conductive region 162, the conductive solder 172, the second electrode 150 and the second ohmic layer 132.

When biases are applied as described above, the light-emitting structure 110 is forward-biased. The forward bias causes the light-emitting pattern 114 to generate light L1 and L2. The light L1 may travel toward the first substrate 100b without being reflected and then exitexit the first substrate 100b. However, the light L2 may be reflected by the second electrode 150 that surrounds the light-emitting structure 110. Then, the reflected light L2 may travel toward the first substrate 100b to exitexit the first substrate 100b.

In particular, the cut pattern region 104 having a predetermined roughness is formed on the second surface of the substrate 100a in the first exemplary embodiment. Thus, the light L1 and L2 can escape from the substrate 100a without being trapped therein. In addition, since the thickness of the substrate 100a is reduced using a laser beam, the probability that the light L1 and L2 will be trapped in the substrate 100a can be reduced. Consequently, the light extraction efficiency of the light-emitting device 1 is improved.

In the first exemplary embodiment, a case where monocrystals are converted into polycrystals using a laser beam has been described. However, the scope of the present inventive concept is not limited to this case. For example, characteristics or material of a region of a substrate may be changed using a laser beam, and the substrate may be cut in the horizontal direction along the region with the changed characteristics or material quality.

Figure 7A:
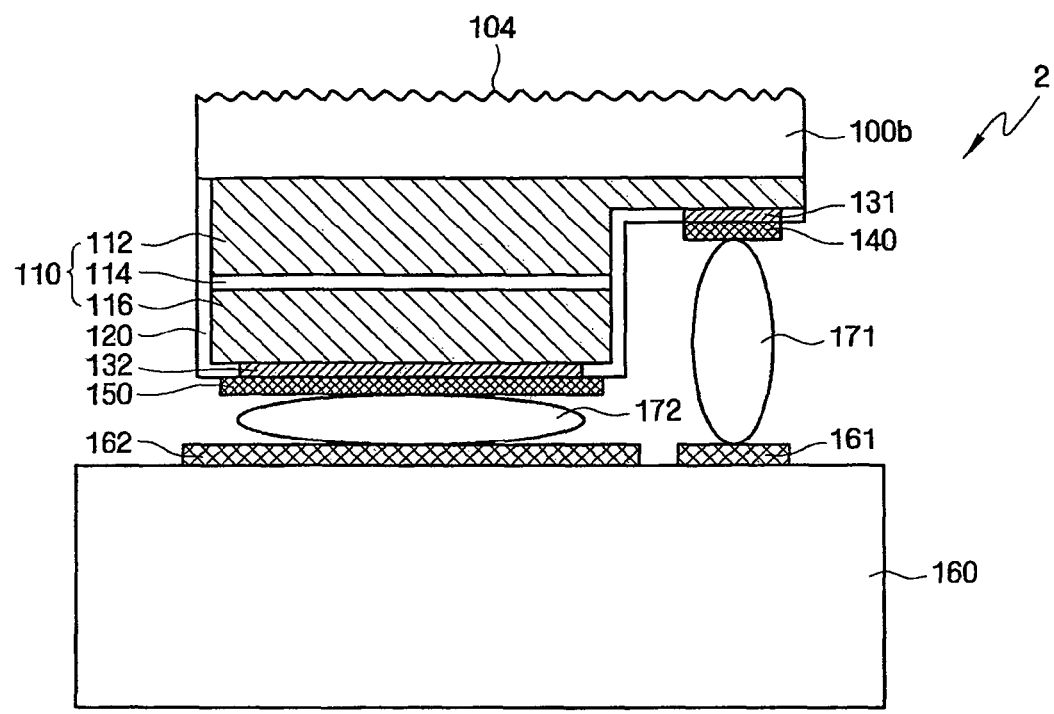
FIGS. 7A and 7B are cross-sectional views of a light-emitting device according to a second exemplary embodiment of the present inventive concept.
Figure 7B:
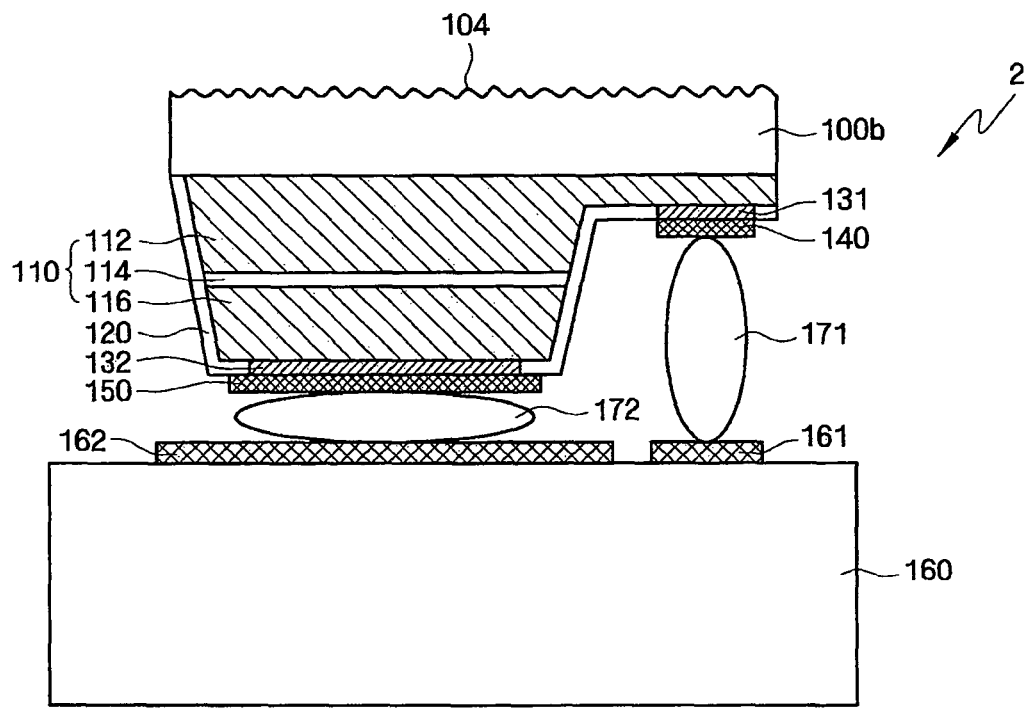

FIGS. 7A and 7B are cross-sectional views of a light-emitting device 2 according to a second exemplary embodiment of the present inventive concept.

Referring to FIGS. 7A and 7B, the light-emitting device 2 according to the second exemplary embodiment is different from the light-emitting device 1 according to the first exemplary embodiment in that a second electrode 150 is formed only on a top surface of a light-emitting structure 110. Sidewalls of the light-emitting structure 110 may not be inclined as shown in FIG. 7A or may be inclined as shown in FIG. 7B. In this case, light generated within the light-emitting structure 110 may travel toward the substrate 100b and then exitexit the substrate 100b. In addition, the generated light may exit the light-emitting structure 110 in a direction toward the sidewalls of the light-emitting structure 110.

Figure 8A:
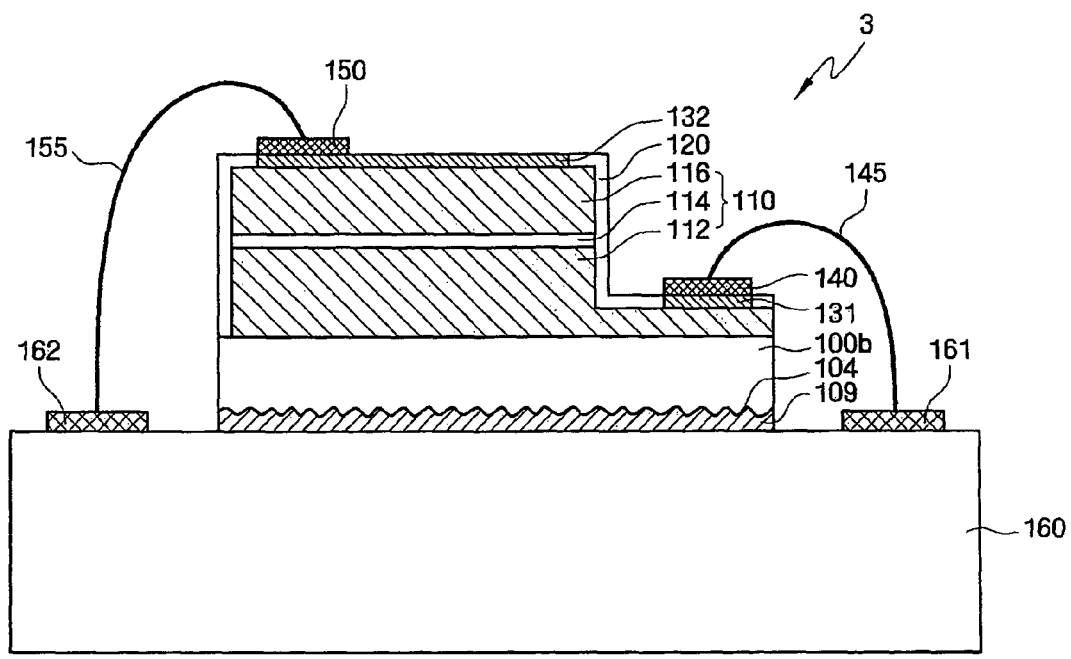
FIGS. 8A and 8B are cross-sectional views of a light-emitting device according to a third exemplary embodiment of the present inventive concept.
Figure 8B:
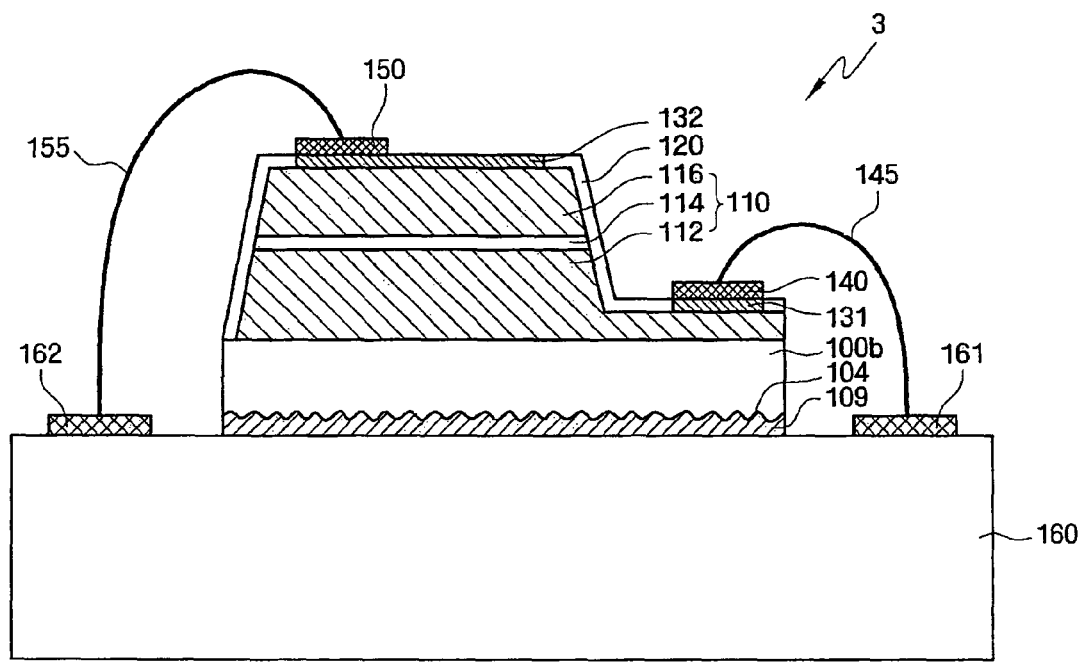
Figure 9:
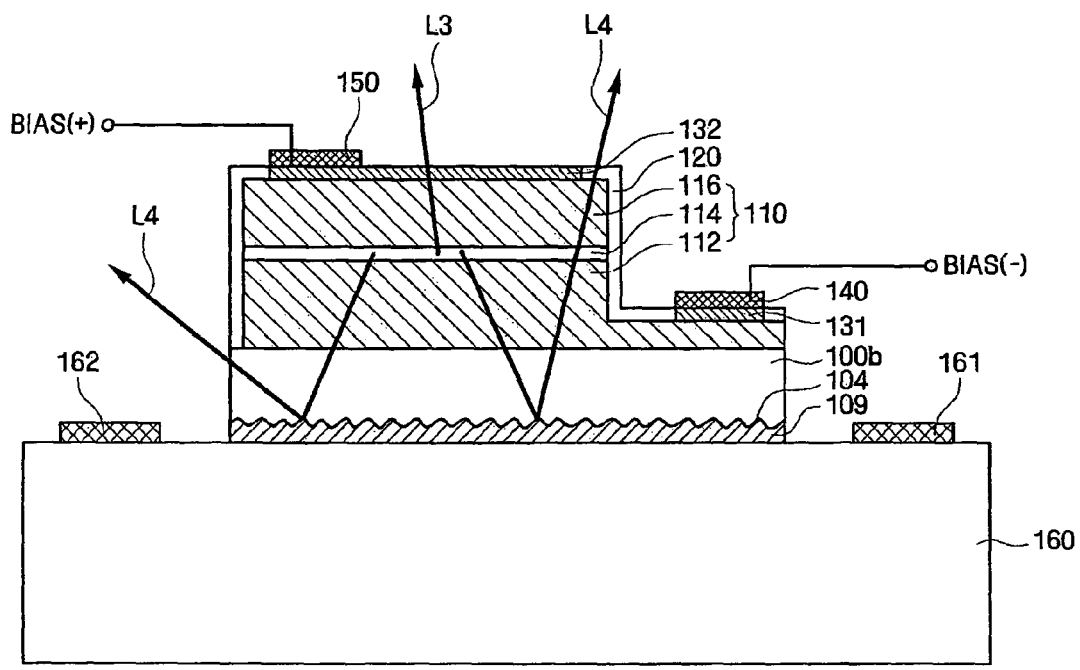
FIG. 9 is a view showing the operation of the light-emitting device according to the third exemplary embodiment of the present inventive concept.

FIGS. 8A and 8B are cross-sectional views of a light-emitting device 3 according to a third exemplary embodiment of the present inventive concept. FIG. 9 is a view showing the operation of the light-emitting device 3 according to the third exemplary embodiment of the present inventive concept. A support substrate 160 shown in FIGS. 8A through 9 may be, for example, a circuit board or a package.

In the light-emitting device 1 according to the first exemplary embodiment shown in FIG. 5, the first substrate 100b, on which the intermediate structure is formed, is attached to the support substrate 160 in a flip-chip manner. In contrast, in the light-emitting device 3 according to the third exemplary embodiment shown in FIGS. 8A and 8B, a first substrate 100b, on which an intermediate structure is formed, is attached to the support substrate 160 in a lateral chip manner. That is, while the first and second electrodes 140 and 150 face the support substrate 160 in the light-emitting device 1 according to the first exemplary embodiment, they do not face the support substrate 160 in the light-emitting device 3 according to the third exemplary embodiment. In addition, a reflective metal film 109 is formed on a second surface of the first substrate 100b on which a cut pattern region 104 is formed.

Sidewalls of a light-emitting structure 110 may not be inclined as shown in FIG. 8A or may be inclined as shown in FIG. 8B. A method of fabricating the light-emitting device 3 according to the third exemplary embodiment will now be described as an example.

In the method of fabricating the light-emitting device 1 described above with reference to FIGS. 1 through 6, the substrate 100a is attached to the support substrate 160 after being separated into individual intermediate structures (i.e., chips). Then, the substrate 100a is cut in the horizontal direction by using a laser beam.

In contrast, a substrate 100a of the light-emitting device 3 according to the third exemplary embodiment is cut in the horizontal direction by using a laser beam when in a wafer state (that is, before being separated into individual chips).

For example, the substrate 100a of the light-emitting device 3 according to the third exemplary embodiment is cut using a laser beam before being attached to the support substrate 160. Here, the substrate 100a may be cut using a laser beam after or before an intermediate structure is formed on a surface of the substrate 100a.

Then, the reflective metal film 109 is formed on the second surface of the first substrate 100b on which the cut pattern region 104 is formed and which remains after the substrate 100a is cut. The reflective metal film 109 may be made of a material having high reflexibility, such as silver or aluminum.

Next, the first substrate 100b is separated into individual intermediate structures (that is, chips).

The first substrate 100b having the intermediate structure formed thereon is attached to the support substrate 160 in a lateral chip manner (that is, such that the second surface of the substrate 100b faces the support substrate 160). Then, a first electrode 140 is connected to a first conductive region 161 by a wire 145, and a second electrode 150 is connected to a second conductive region 162 by a wire 155.

The operation of the light-emitting device 3 according to the third exemplary embodiment will now be described with reference to FIG. 9.

Referring to FIG. 9, light L3 generated within the light-emitting structure 110 may exit the light-emitting structure 110 in a direction toward the second electrode 150 without being reflected. In addition, light L4 generated within the light-emitting structure 110 may be reflected by the reflective metal film 109 and then exit the light-emitting structure 110 in a direction toward the sidewalls of the light-emitting structure 110 or in the direction toward the second electrode 150.

In the following drawings, the light-emitting device 1 according to the first exemplary embodiment is shown for ease of description. However, it is apparent to those of ordinary skill in the art that the following description is also applicable to the light-emitting device 2 or 3 according to the second or third exemplary embodiments.

Figure 10:
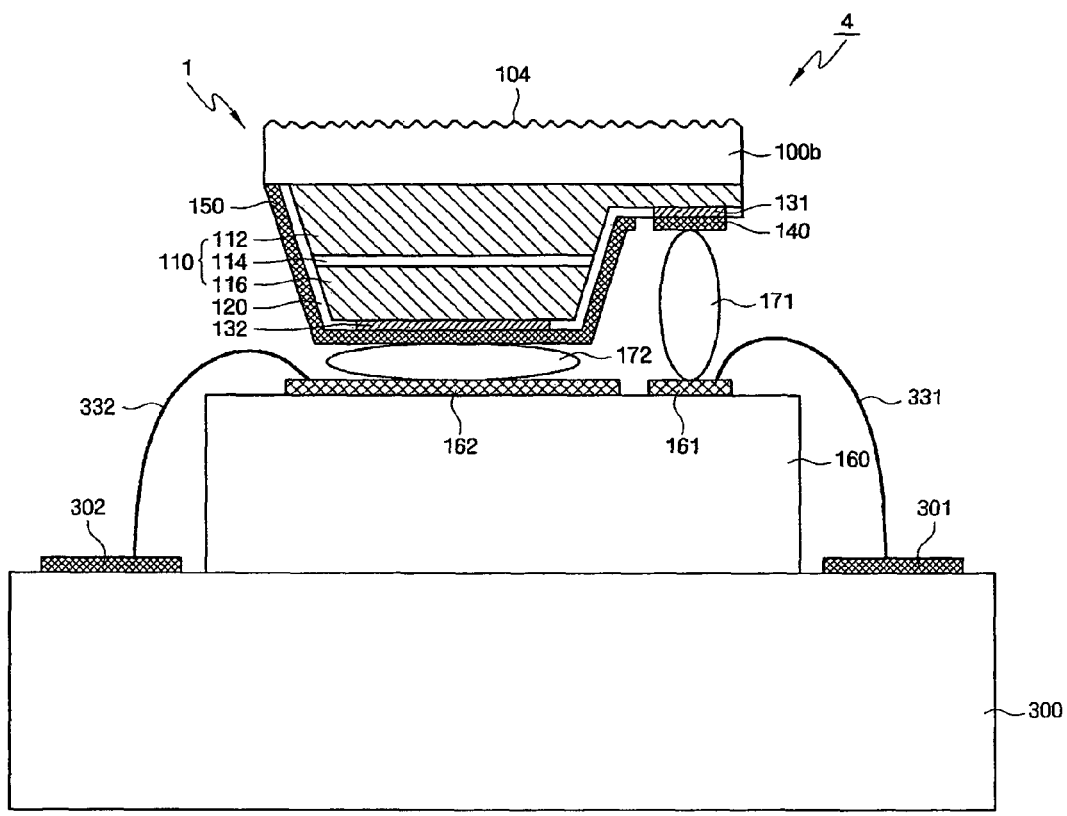
FIG. 10 is a view showing a light-emitting apparatus according to a fourth exemplary embodiment of the present inventive concept.

FIG. 10 is a view showing a light-emitting apparatus 4 according to a fourth exemplary embodiment of the present inventive concept.

Referring to FIG. 10, the light-emitting apparatus 4 according to the fourth exemplary embodiment includes a circuit board 300 and the light-emitting device 1 disposed on the circuit board 300. Here, the support substrate 160 of the light-emitting device 1 is a submount.

The circuit board 300 includes a third conductive region 301 and a fourth conductive region 302 which are electrically insulated from each other. The third conductive region 301 and the fourth conductive region 302 are disposed on a surface of the circuit board 300.

The first electrode 140 of the light-emitting device 1 may be connected to the first conductive region 161 of the support substrate 160 by the conductive solder 171, and the first conductive region 161 may be connected to the third conductive region 301 by a wire 331. The second electrode 150 of the light-emitting device 1 may be connected to the second conductive region 162 of the support substrate 160 by the conductive solder 172, and the second conductive region 162 may be connected to the fourth conductive region 302 by a wire 332. However, it is obvious that those of ordinary skill in the art to which the present inventive concept pertains can connect the above components in different ways from the way shown in FIG. 10.

Figure 11:
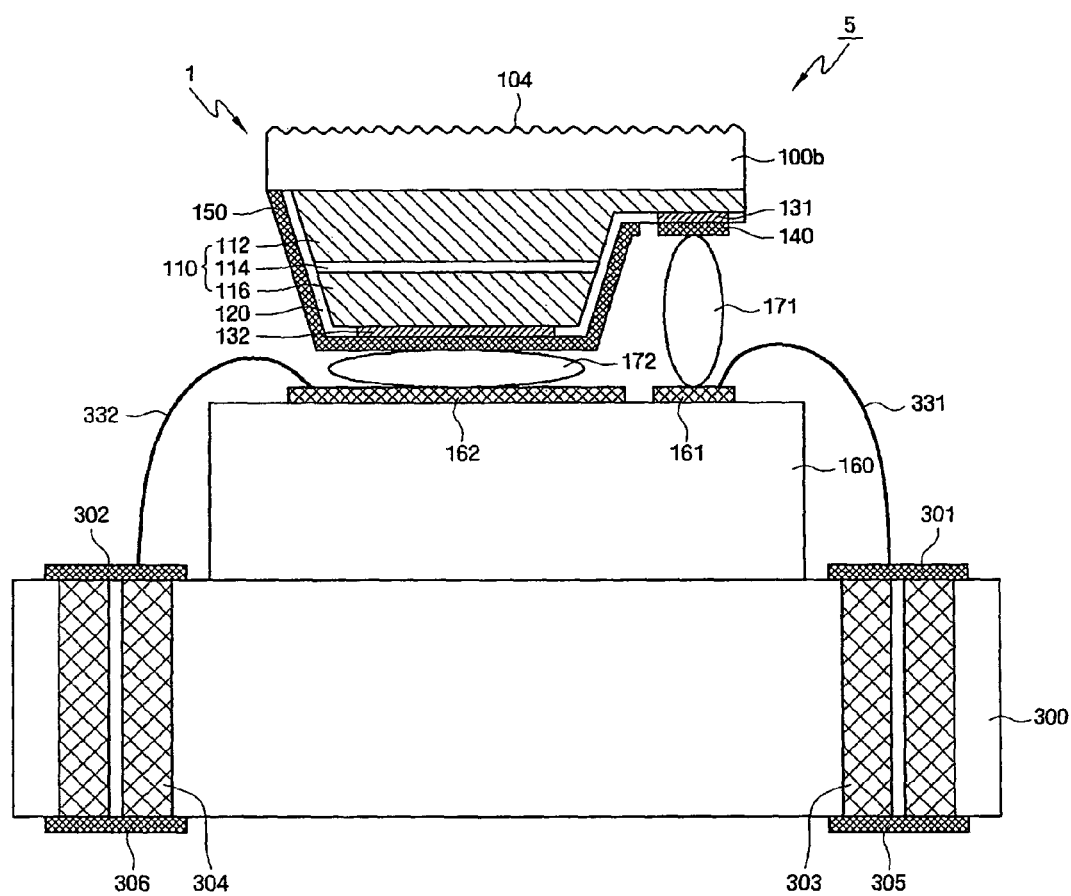
FIG. 11 is a view showing a light-emitting apparatus according to a fifth exemplary embodiment of the present inventive concept.

FIG. 11 is a view showing a light-emitting apparatus 5 according to a fifth exemplary embodiment of the present inventive concept. Referring to FIG. 11, the light-emitting apparatus 5 according to the fifth exemplary embodiment is different from the light-emitting apparatus 4 according to the fourth exemplary embodiment in that a circuit board 300 includes first and second through vias 303 and 304.

Specifically, a third conductive region 301 and a fourth conductive region 302, which are electrically insulated from each other, are formed on a surface of the circuit board 300, and a fifth conductive region 305 and a sixth conductive region 306, which are electrically insulated from each other, are formed on the other surface of the circuit board 300. The third conductive region 301 is connected to the fifth conductive region 305 by the first through vias 303, and the fourth conductive region 302 is connected to the sixth conductive region 306 by the second through vias 304.

Figure 12:
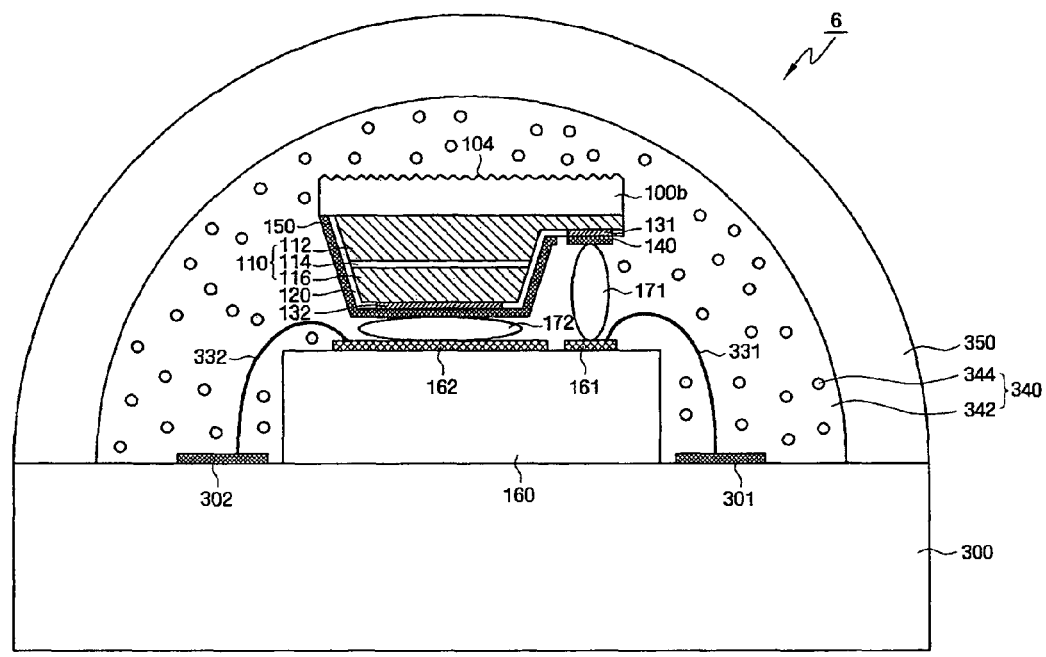
FIG. 12 is a view showing a light-emitting apparatus according to a sixth exemplary embodiment of the present inventive concept.

FIG. 12 is a view showing a light-emitting apparatus 6 according to a sixth exemplary embodiment of the present inventive concept. Referring to FIG. 12, the light-emitting apparatus 6 according to the sixth exemplary embodiment is different from the light-emitting apparatus 4 according to the fourth exemplary embodiment in that it includes a phosphor layer 340 which surrounds the light-emitting device 1 and second transparent resin 350 which surrounds the phosphor layer 340.

The phosphor layer 340 may be a mixture of first transparent resin 342 and phosphors 344. The phosphors 344 dispersed within the phosphor layer 340 absorb light emitted from the light-emitting device 1 and convert the wavelength of the light into another wavelength. Thus, when the phosphors 344 are dispersed more evenly, the light-emitting properties of the light-emitting apparatus 6 can be improved. In addition, when the phosphors 344 are dispersed more evenly, the wavelength conversion and color-mixing effect of the phosphors 344 can be enhanced. As shown in the drawing, the phosphor layer 340 may be formed higher than the wires 331 and 332 in order to protect the wires 331 and 332.

For example, the light-emitting apparatus 6 may include the phosphor layer 340 in order to produce a white color. When the light-emitting device 1 emits light having a blue wavelength, the phosphors 344 may include yellow phosphors. The phosphors 344 may also include red phosphors in order to increase a color-rendering index (CRI). When the light-emitting device 1 emits light having an ultraviolet (UV) wavelength, the phosphors 344 may include all of red, green and blue phosphors.

The first transparent resin 342 may be any material that can disperse the phosphors 344 in a stable manner. For example, the first transparent resin 342 may be epoxy resin, silicon resin, hard silicon resin, denatured silicon resin, urethane resin, oxetane resin, acrylic resin, polycarbonate resin, or polyimide resin.

The phosphors 344 may be any material that can absorb light from the light-emitting structure 110 and convert the wavelength of the absorbed light. For example, the phosphors 344 may be at least one of nitride-based or oxynitride-based phosphors activated mainly by a lanthanoid element such as europium (Eu) or cerium (Ce); alkaline earth halogen apatite phosphors activated mainly by a lanthanoid element such as Eu or a transition metal element such as manganese (Mn); alkaline earth metal halogen borate phosphors; alkaline earth metal aluminate phosphors; alkaline earth silicate phosphors; alkaline earth sulfide phosphors; alkaline earth thiogallate phosphors; alkaline earth silicon nitride phosphors; germanate phosphors; rare earth aluminate phosphors activated mainly by a lanthanoid element such as Ce; rare earth silicate phosphors; and organic or organic complex phosphors activated mainly by a lanthanoid element such as Eu. Specifically, phosphors listed below may be used. However, the phosphors 344 are not limited to the following phosphors.

Examples of nitride-based phosphors activated mainly by a lanthanoid element such as Eu or Ce include $M_2Si_5N_8$:Eu (M is at least one of Sr, Ca, Ba, Mg and Zn), $MSi_7N_{10}$:Eu, $M_{1.8}Si_5O_{0.2}N_8$:Eu, and $M_{0.9}Si_7O_{0.1}N_{10}$:Eu (M is at least one of Sr, Ca, Ba, Mg and Zn).

Examples of oxynitride-based phosphors activated mainly by a lanthanoid element such as Eu or Ce include $MSi_2O_2N_2$:Eu (M is at least one of Sr, Ca, Ba, Mg and Zn).

Examples of alkaline earth halogen apatite phosphors activated mainly by a lanthanoid element such as Eu or a transition metal element such as Mn include $M_5(PO_4)_3X$:R (M is at least one of Sr, Ca, Ba, Mg and Zn, X is at least one of F, Cl, Br and I, and R is at least one of Eu, Mn and Eu).

Examples of alkaline earth metal halogen borate phosphors include $M_2B_5O_9X$:R (M is at least one of Sr, Ca, Ba, Mg and Zn, X is at least one of F, Cl, Br and I, and R is at least one of Eu, Mn and Eu).

Examples of alkaline earth metal aluminate phosphors include $SrAl_2O_4$:R, $Sr_4Al_{14}O_{25}$:R, $CaAl_2O_4$:R, $BaMg_2Al_{16}O_{27}$:R, $BaMg_2Al_{16}O_{12}$:R, and $BaMgAl_{10}O_{17}$:R (R is at least one of Eu, Mn and Eu).

Examples of alkaline earth sulfide phosphors include $La_2O_2S$:Eu, $Y_2O_2S$:Eu, and $Gd_2O_2S$:Eu.

Examples of rare earth aluminate phosphors activated mainly by a lanthanoid element such as Ce include YAG phosphors represented by compositional formulas such as $Y_3Al_5O_{12}$:Ce, $(Y_{0.8}Gd_{0.2})_3Al_5O_{12}$:Ce, $Y_3(Al_{0.8}Ga_{0.2})_5O_{12}$:Ce, and $(Y, Gd)_3(Al, Ga)_5O_{12}$. Other examples include phosphors such as $Tb_3Al_5O_{12}$:Ce and $Lu_3Al_5O_{12}$:Ce in which part or all of Y has been replaced by Tb, Lu, or the like.

Alkaline earth silicate phosphors contain silicate, and major examples of the alkaline earth silicate phosphors include $(SrBa)_2SiO_4$:Eu.

Examples of other phosphors include ZnS:Eu, $Zn_2GeO_4$:Mn, and $MGa_2S_4$:Eu (M is at least one of Sr, Ca, Ba, Mg and Zn, and X is at least one of F, Cl, Br, and I).

The above phosphors may also include at least one of Tb, Cu, Ag, Au, Cr, Nd, Dy, Co, Ni and Ti, instead of or in addition to Eu. Furthermore, other phosphors that offer similar performance and effects to those of the phosphors listed above can also be used.

The second transparent resin 350 is lens-shaped and diffuses light emitted from the light-emitting device 1. The curvature and flatness of the second transparent resin 350 may be adjusted to control the light diffusion/extraction properties. The second transparent resin 350 surrounds the phosphor layer 340 to protect the phosphor layer 340. That is, the second transparent resin 350 surrounds the phosphor layer 340 because the properties of the phosphor layer 340 may deteriorate when contacting, for example, moisture.

The second transparent resin 350 may be any material through which light can pass. For example, the second transparent resin 350 may be epoxy resin, silicon resin, hard silicon resin, denatured silicon resin, urethane resin, oxetane resin, acrylic resin, polycarbonate resin, or polyimide resin.

Figure 13:
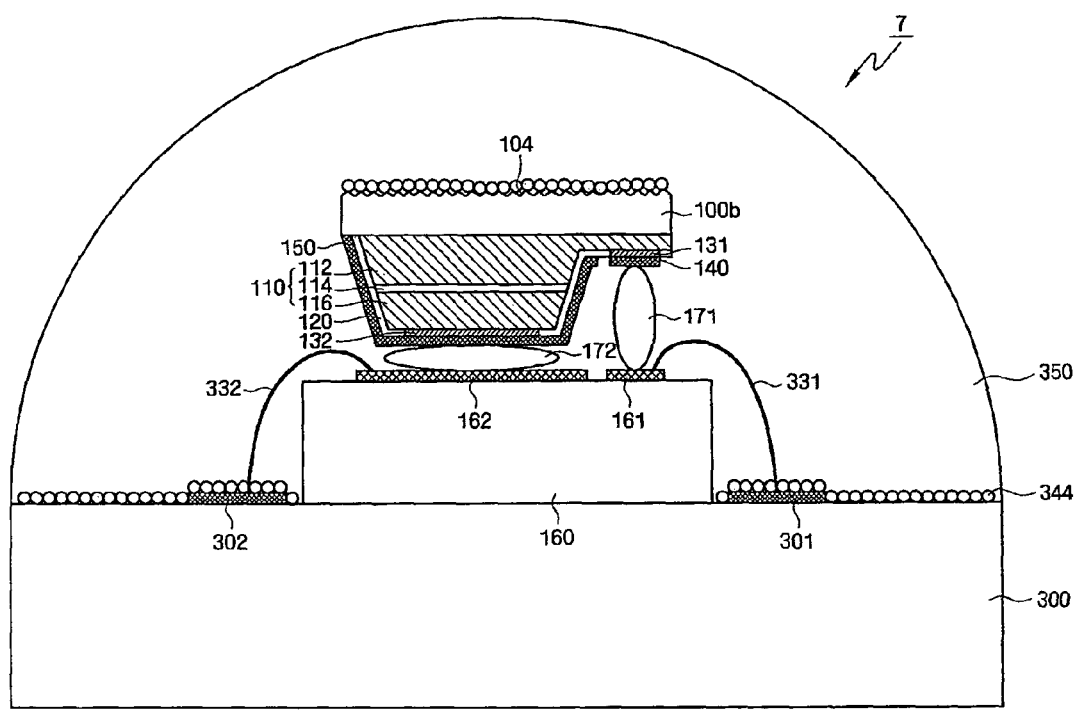
FIG. 13 is a view showing a light-emitting apparatus according to a seventh exemplary embodiment of the present inventive concept.

FIG. 13 is a view showing a light-emitting apparatus 7 according to a seventh exemplary embodiment of the present inventive concept. Referring to FIG. 13, phosphors 344 are formed along the profiles of the light-emitting device 1 and a circuit board 300. Here, the phosphors 344 may be coated on the light-emitting device 1 and the circuit board 300 without requiring first transparent resin (indicated by reference numeral 342 in FIG. 12).

When the phosphors 344 are coated on the light-emitting device 1 and the circuit board 300 without requiring the first transparent resin, a monolayer 350 of transparent resin may surround the light-emitting device 1.

Figure 14:
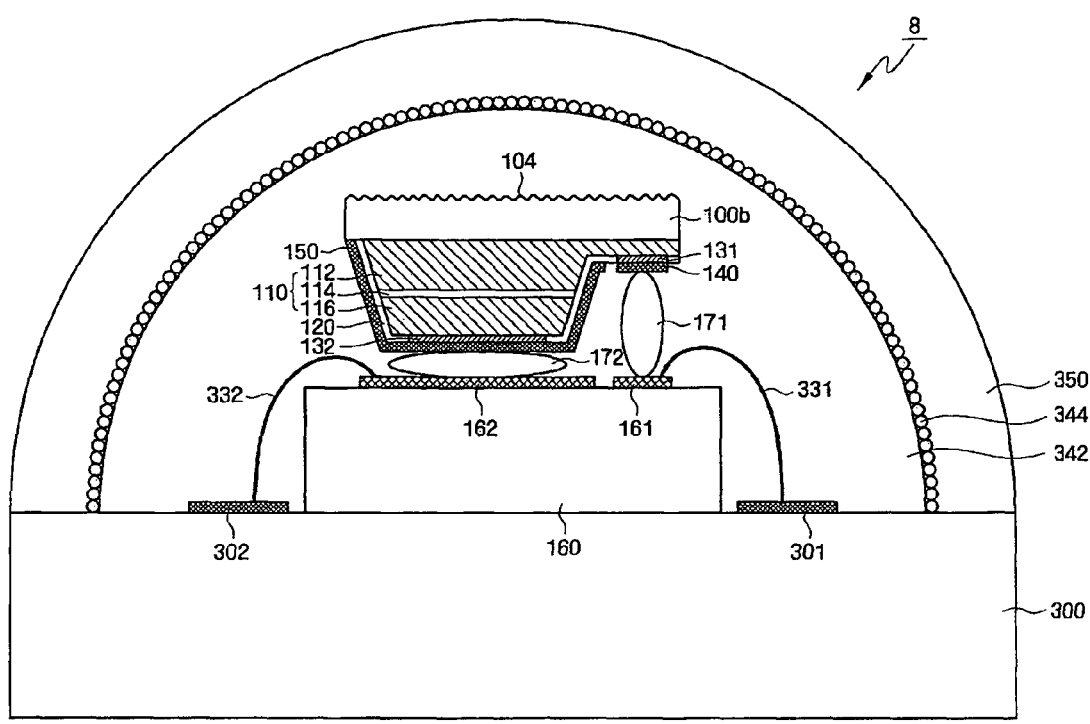
FIG. 14 is a view showing a light-emitting apparatus according to an eighth exemplary embodiment of the present inventive concept.

FIG. 14 is a view showing a light-emitting apparatus 8 according to an eighth exemplary embodiment of the present inventive concept. Referring to FIG. 14, the light-emitting apparatus 8 according to the eighth exemplary embodiment is different from the light-emitting apparatus 4 according to the fourth exemplary embodiment in that it includes first transparent resin 342 which surrounds the light-emitting device 1, phosphors 344 which are formed on the first transparent resin 342, and second transparent resin 350 which is formed on the phosphors 344. That is, since the first transparent resin 342 and the phosphors 344 are coated separately without being mixed with each other, the phosphors 344 may be formed thinly and conformally along a surface of the first transparent resin 342.

Figure 15:
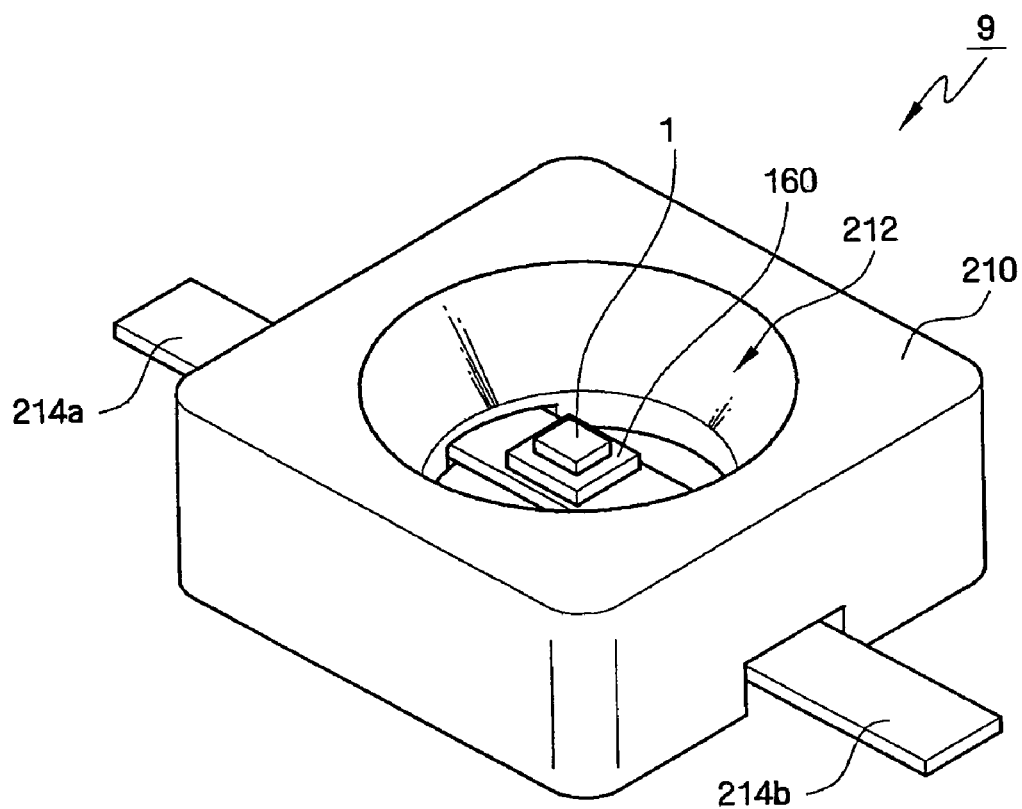
FIG. 15 is a view showing a light-emitting apparatus according to a ninth exemplary embodiment of the present inventive concept.

FIG. 15 is a view showing a light-emitting apparatus 9 according to a ninth exemplary embodiment of the present inventive concept. The light-emitting apparatus 9 according to the ninth exemplary embodiment is a topview-type light-emitting package. However, the present inventive concept is not limited thereto.

Referring to FIG. 15, the support substrate 160 on which the light-emitting device 1 is mounted is disposed on a package body 210. Specifically, a slot 212 is formed in the package body 210, and the support substrate 160 having the light-emitting device 1 mounted thereon is disposed in the slot 212. The slot 212 may have inclined sidewalls. Thus, light emitted from the light-emitting device 1 may be reflected by the sidewalls and then proceed forward. The size of the slot 212 may be determined in view of the degree to which light generated by the light-emitting device 1 is reflected by the sidewalls of the slot 212, the angle at which the light is reflected by the sidewalls of the slot 212, the type of transparent resin that fills the slots 212, the type of phosphors, and the like. The support substrate 160 may be placed in the center of the slot 212 since chromatic non-uniformity can be easily prevented when the light-emitting device 1 is equidistant from the sidewalls of the slot 212.

The package body 210 may be made of an excellently lightfast organic material, such as silicon resin, epoxy resin, acrylic resin, urea resin, fluorine resin or imide resin, or may be made of an excellently lightfast inorganic material such as glass or silica gel. In addition, thermosetting resin may be used in order to prevent heat from melting package body 210 while the light-emitting apparatus 9 is fabricated. Various fillers, such as aluminum nitride, aluminum oxide and compounds of the same, may also be added to resin in order to relieve thermal stress of the resin. The package body 210 may also be made of a material other than resin. For example, part (e.g., the sidewalls) or all of the package body 210 may be made of a metal material or a ceramic material. When all of the package body 210 is made of a metal material, heat generated by the light-emitting device 1 can be easily dissipated out of the package body 210.

Leads 214a and 214b are formed in the package body 210 and are electrically connected to the light-emitting device 1. The light-emitting device 1 may be electrically connected to the support substrate 160, and the support substrate 160 may be connected to the leads 214a and 214b by vias. The leads 214a and 214b may be made of a highly thermally conductive material since heat generated by the light-emitting device 1 can be dissipated directly out of the package body 210 through the leads 214 and 214b when the leads 214a and 214b are made of a highly thermally conductive material.

Although not shown in the drawing, at least part of the slot 212 may be filled with a transparent resin layer. In addition, phosphors may be formed on the transparent resin layer. Alternatively, the phosphors may be mixed with the transparent resin layer.

Figure 16:
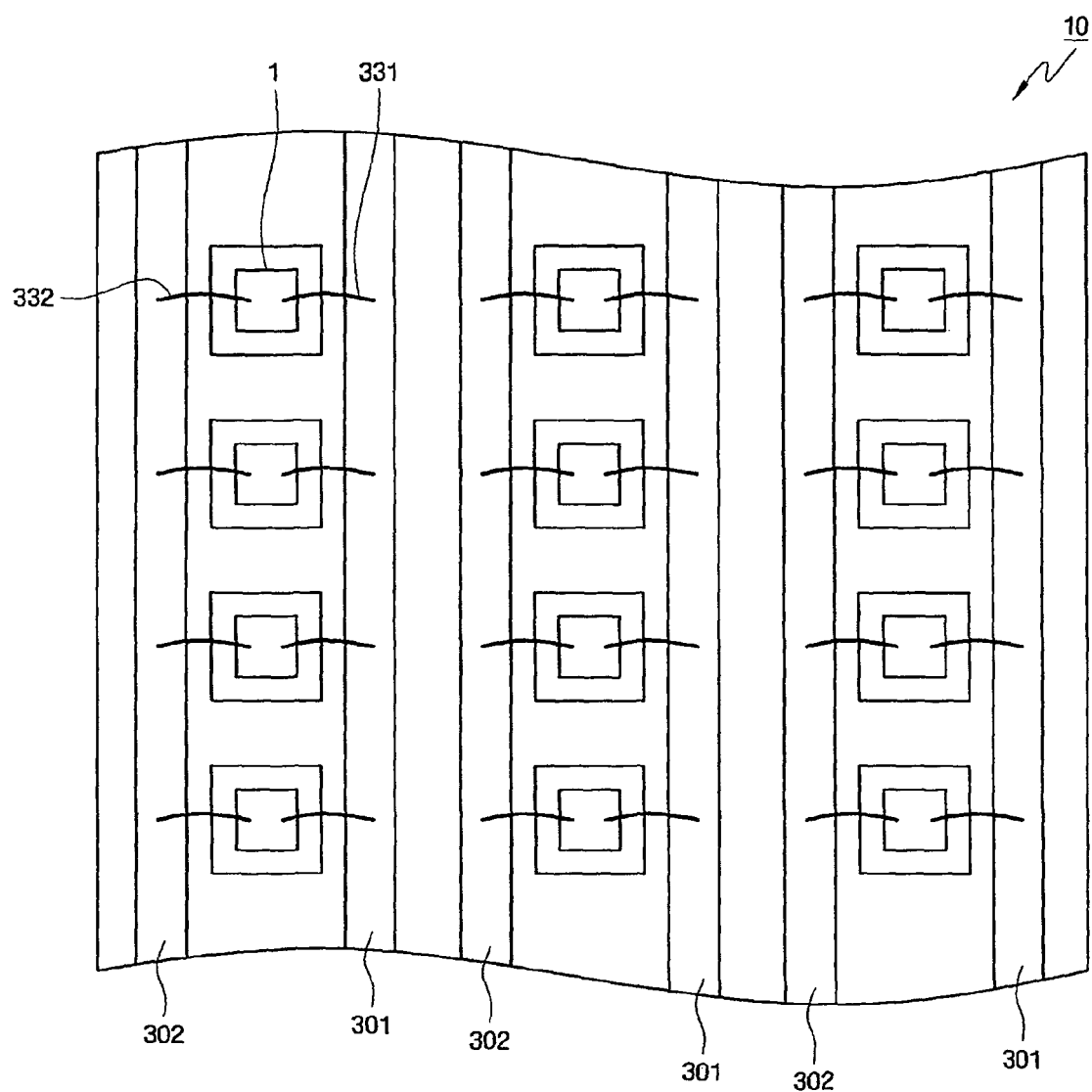
FIGS. 16 through 18 are views showing a light-emitting apparatus according to a tenth exemplary embodiment of the present inventive concept.
Figure 17:
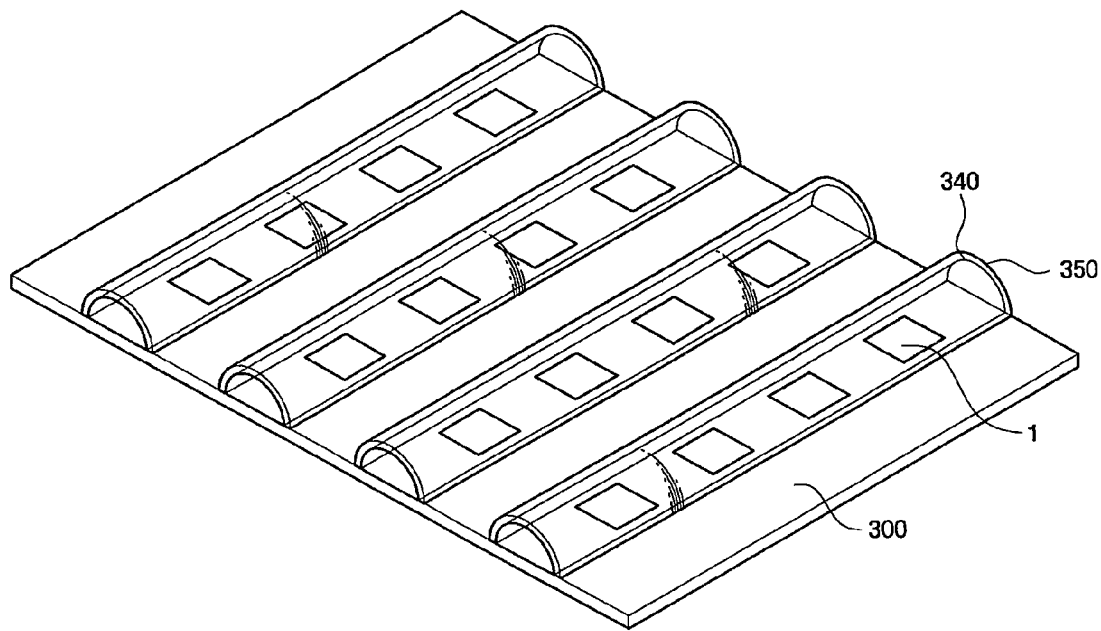
Figure 18:
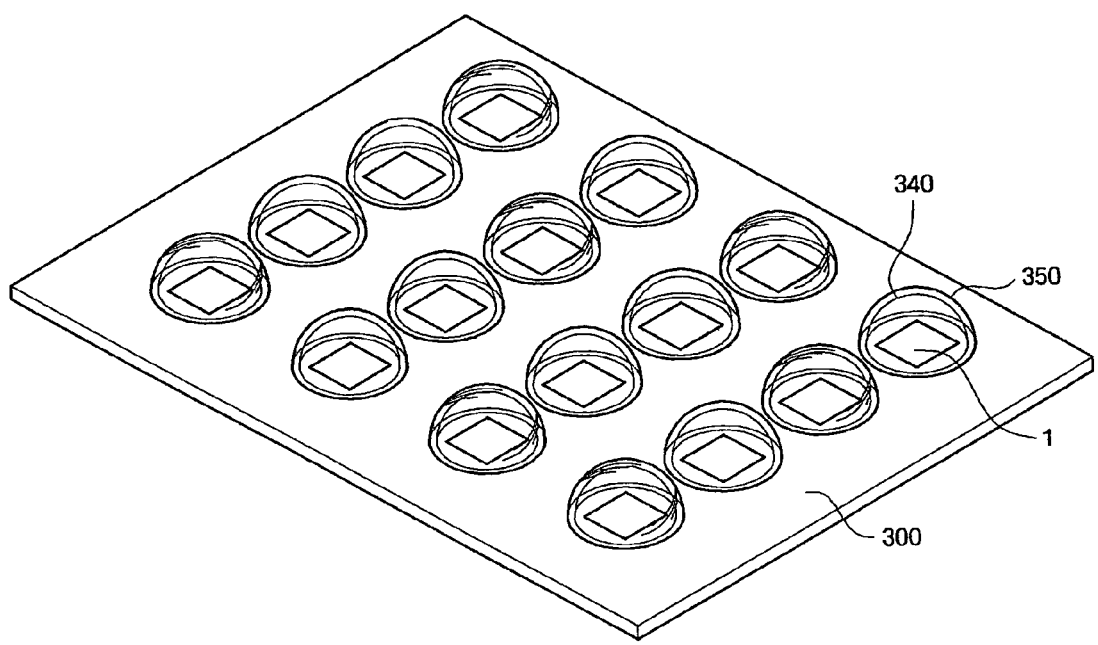

FIGS. 16 through 18 are views showing a light-emitting apparatus 10 according to a tenth exemplary embodiment of the present inventive concept. Specifically, FIGS. 16 through 18 are views showing an array of the light-emitting devices 1 disposed on a circuit board 300. In particular, FIGS. 17 and 18 show phosphor layers 340 and second transparent resin 350 which are formed on the array of the light-emitting devices 1.

Referring to FIG. 16, third conductive regions 301 and fourth conductive regions 302 are formed on the circuit board 300 and extend in one direction to be parallel to each other. The light-emitting devices 1 are arranged in a line in the direction in which the third and fourth conductive regions 301 and 302 extend. As described above, the first electrode 140 of each of the light-emitting devices 1 may be connected to a corresponding one of the third conductive regions 301 by the support substrate 160 and a wire 331, and the second electrode 150 of each of the light-emitting device 1 may be connected to a corresponding one of the fourth conductive regions 302 by the support substrate 160 and a wire 332.

When appropriate biases are applied to the third and fourth conductive regions 301 and 302, the light-emitting structure 110 (see FIG. 1) of each of the light-emitting devices 1 may be forward-biased. Accordingly, the light-emitting devices 1 may emit light.

Referring to FIG. 17, the phosphor layers 340 and the second transparent resin 350 may be formed in a linear manner. For example, when the light-emitting devices 1 are arranged along the direction in which the third and fourth conductive regions 301 and 302 extend, the phosphor layers 340 and the second transparent resin 350 may also be arranged along the direction in which the third and fourth conductive regions 301 and 302 extend. In addition, the phosphors 340 and the second transparent resin 350 may completely surround the third and fourth conductive regions 301 and 302.

Referring to FIG. 18, the phosphor layers 340 and the second transparent resin 350 may be formed in a dotted manner. In this case, each of the phosphor layers 340 and each of the second transparent resin 350 may surround a corresponding one of the light-emitting devices 1.

Figure 19:
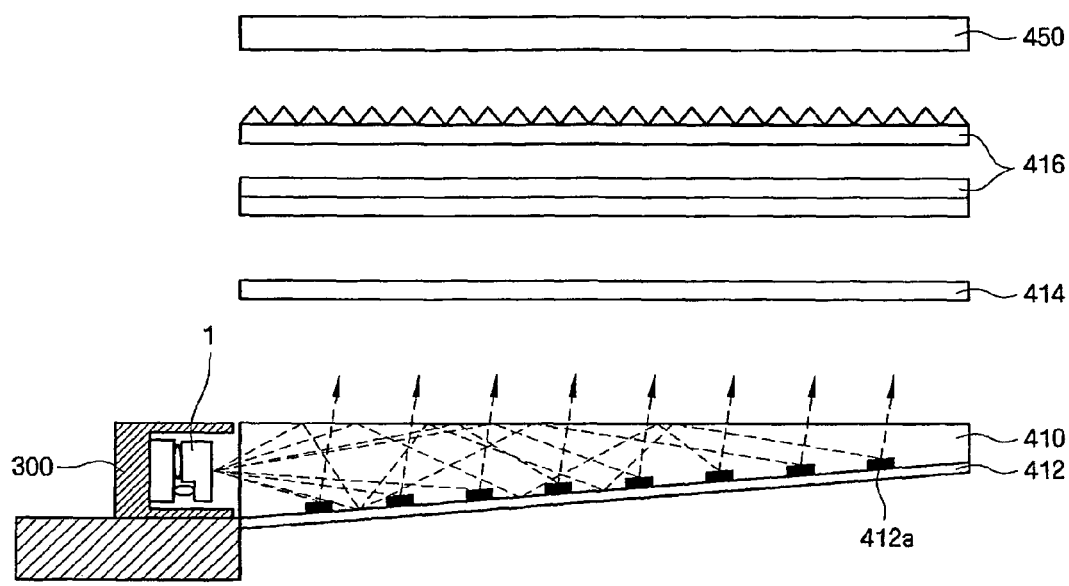
FIG. 19 is a view showing a light-emitting apparatus according to an eleventh exemplary embodiment of the present inventive concept.

FIG. 19 is a view showing a light-emitting apparatus according to an eleventh exemplary embodiment of the present inventive concept. The light-emitting apparatus of FIG. 19 can be applied to various apparatuses such as lighting apparatuses, display apparatuses, and mobile apparatuses (mobile phones, MP3 players, navigations, etc.). The light-emitting apparatus shown in FIG. 19 is an edge-type backlight unit (BLU) used in a liquid crystal display (LCD). Since LCDs are not self-luminous, they use a BLU as their light source. Generally, a BLU is disposed behind a liquid crystal panel and provides light to the liquid crystal panel.

Referring to FIG. 19, the BLU includes the light-emitting device 1, a light guide plate 410, a reflective plate 412, a diffusion sheet 414, and a pair of prism sheets 416. The light-emitting device 1 provides light and may be of a side-view type.

The light guide plate 410 guides light toward a liquid crystal panel 450. The light guide plate 410 is a panel made of a transparent plastic material such as acryl and guides light emitted from the light-emitting device 1 toward the liquid crystal panel 450 which is disposed above the light guide plate 410. Various patterns 412a are printed at the back of the light guide plate 410 to guide light, which is input to the light guide plate 410, toward the liquid crystal panel 450.

The reflective plate 412 is disposed on a lower surface of the light guide plate 410 and thus reflects light, which is emitted downward from the light guide plate 410, upward. That is, the reflective plate 412 reflects light, which has not been reflected by the various patterns 412a printed at the back of the light guide plate 410, toward an output surface of the light guide plate 410. In so doing, the reflective plate 412 reduces light loss and improves the uniformity of light which is output from the output surface of the light guide plate 410.

The diffusion sheet 414 diffuses light output from the light guide plate 410, thereby preventing the light from being concentrated in a specific area.

Each of the prism sheets 416 has a predetermined array of triangular prisms on an upper surface thereof. The prism sheets 416 typically consist of two sheets, and an array of triangular prisms formed on one of the two prism sheets 416 cross an array of triangular prisms formed on the other one of the two prism sheets 416 at a predetermined angle, so that light diffused by the diffusion sheet 414 can proceed in a direction perpendicular to the liquid crystal panel 450.

Figure 20:
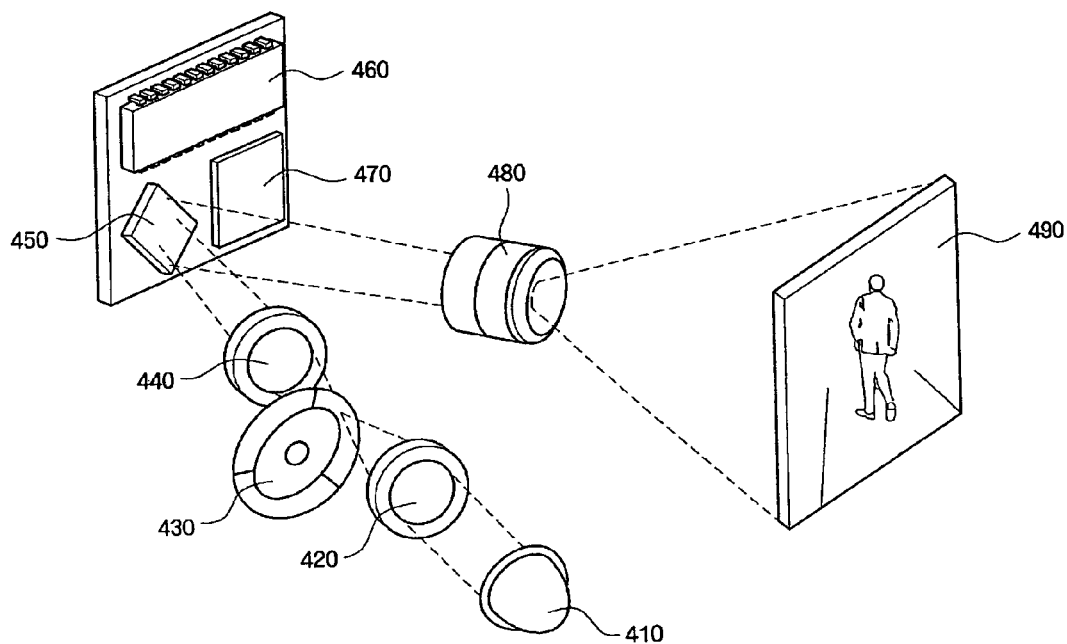
FIGS. 20 through 23 are views showing light-emitting apparatuses according to twelfth through fifteenth exemplary embodiments of the present inventive concept.
Figure 21:
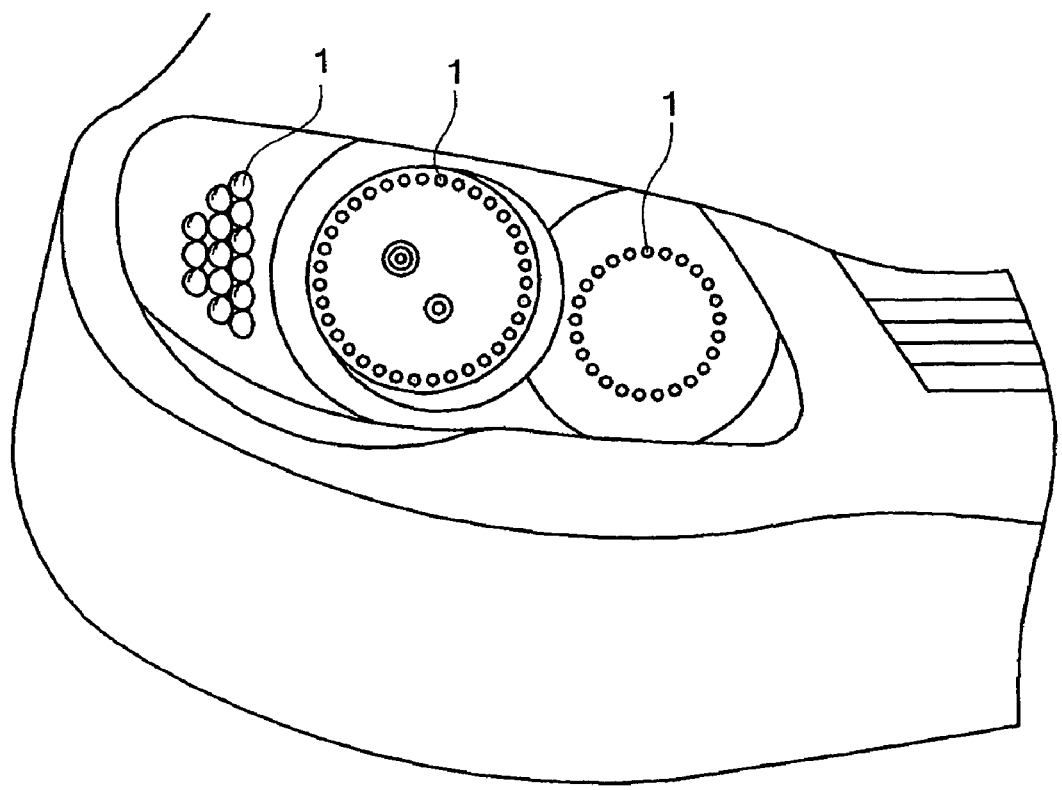
Figure 22:
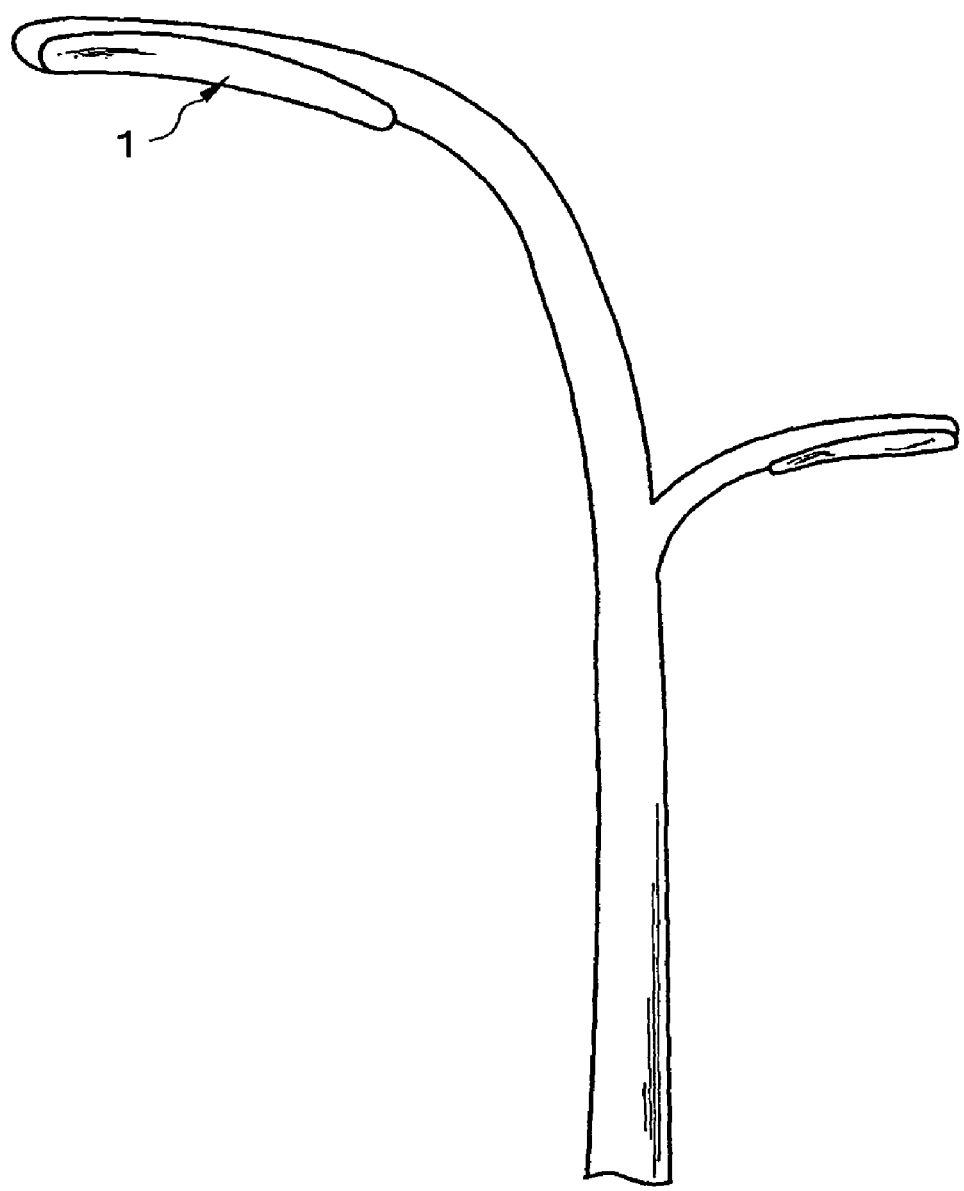
Figure 23:
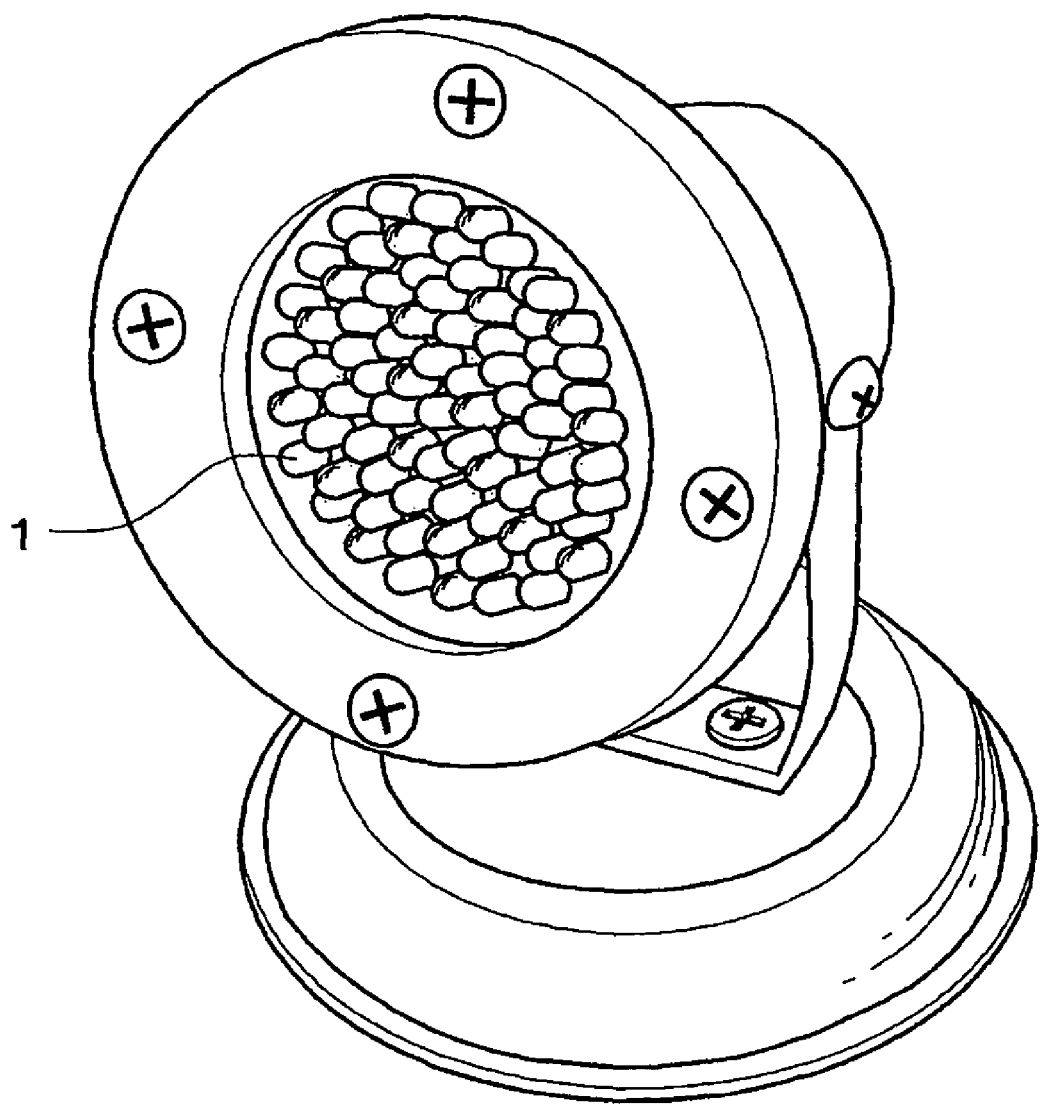

FIGS. 20 through 23 are views showing light-emitting apparatuses according to twelfth through fifteenth exemplary embodiments of the present inventive concept. The light-emitting apparatuses shown in FIGS. 20 through 23 are exemplary end products to which the light-emitting device 1 described above can been applied. Specifically, FIG. 20 shows a projector, FIG. 21 shows a headlight of a vehicle, FIG. 22 shows a streetlight, and FIG. 23 shows a lamp. The light-emitting device 1 used in the light-emitting apparatuses of FIGS. 20 through 23 may be of a top-view type.

Referring to FIG. 20, light emitted from a light source 410 passes through a condensing lens 420, a color filter 430, and a shaping lens 440. Then, the light is reflected by a digital micro-mirror device 450 and passes through a projection lens 480 to reach a screen 490. A light-emitting device according to the present inventive concept is included in the light source 410.

While the present inventive concept has been particularly shown and described with reference to exemplary embodiments thereof, it will be understood by those of ordinary skill in the art that various changes in form and detail may be made therein without departing from the spirit and scope of the present inventive concept as defined by the following claims. The exemplary embodiments should be considered in a descriptive sense only and not for purposes of limitation.

What is claimed is:

1. A method of fabricating a light-emitting apparatus, the method comprising:
    preparing a monocrystalline substrate;
    forming an intermediate structure on the substrate, the intermediate structure comprising a light-emitting structure which comprises a first conductive pattern of a first conductivity type, a light-emitting pattern, and a second conductive pattern of a second conductivity type stacked sequentially, a first electrode which is electrically connected to the first conductive pattern, and a second electrode which is electrically connected to the second conductive pattern,
    wherein the first electrode and the second electrode include at least one of W, Pt and titanium (Ti), and the second electrode of the light-emitting device is connected to a first conductive region of a support substrate by a conductive solder;
    forming a polycrystalline region, which extends in a horizontal direction, by irradiating a laser beam to the substrate in the horizontal direction; and
    cutting the substrate in the horizontal direction along the polycrystalline region.

2. The method of claim 1, further comprising bonding the substrate having the intermediate structure formed thereon to a support substrate between the forming of the intermediate structure and the forming of the polycrystalline region.

3. The method of claim 2, wherein the first conductive pattern is wider than the second conductive pattern such that the first conductive pattern has a protruding region, the first electrode is formed on the protruding region of the first conductive pattern, the second electrode is formed on the second conductive pattern, and the substrate having the intermediate structure formed thereon is bonded to the support substrate such that the first and second electrodes face the support substrate.

4. The method of claim 1, wherein sidewalls of the light-emitting structure are inclined, and the second electrode is formed on a top surface and the sidewalls of the light-emitting structure.

5. The method of claim 1, wherein when the substrate is cut in the horizontal direction, the substrate is divided into a first substrate and a second substrate from the polycrystalline region, wherein the intermediate structure is formed on a first surface of one of the first and second substrates, and a cut pattern region is formed on a second surface of one of the first and second substrates, wherein at least part of the cut pattern region is polycrystalline.

6. A method of fabricating a light-emitting apparatus, the method comprising:
    preparing a monocrystalline substrate;
    forming an intermediate structure on the substrate, the intermediate structure comprising a light-emitting structure which comprises a first conductive pattern of a first conductivity type, a light-emitting pattern, and a second conductive pattern of a second conductivity type stacked sequentially, an electrode electrically connected to the second conductive pattern,
    wherein the electrode includes at least one of W, Pt and titanium (Ti), and the electrode of the intermediate structure is connected to a first conductive region of a support substrate by a conductive solder;
    forming a region, whose material quality is different from that of the other regions of the substrate and which extends in a horizontal direction, by irradiating a laser beam to the substrate in the horizontal direction; and
    cutting the substrate in the horizontal direction along the region.

7. The method of claim 6, further comprising the substrate is made of sapphire (Al2O3), silicon carbide (SiC), or gallium nitride (GaN).

8. The method of claim 6, further comprising the light-emitting pattern includes AlGaN or InGaN.

9. The method of claim 6, further comprising the light-emitting pattern have a multiple quantum well (MQW) structure.

10. The method of claim 6, wherein the first conductivity type is an n-type and the second conductivity type is a p-type.

11. The method of claim 6, further comprising an ohmic layer is formed between the light-emitting structure and the electrode.

12. The method of claim 11, wherein the ohmic layer includes at least one of indium tin oxide (ITO), zinc (Zn), zinc oxide (ZnO), silver (Ag), tin (Ti), aluminum (Al), aurum (Au), nickel (Ni), indium oxide (In2O3), tin oxide (SnO2), copper (Cu), tungsten (W), and platinum (Pt).

13. The method of claim 6, further comprising a buffer layer is formed between the substrate and the first conductive pattern.

14. The method of claim 13, wherein the buffer layer is made of InAlGaN or SiCN.

15. The method of claim 6, further comprising the first conductive region is connected to a second conductive region by a wire.

* * * * *